(12) United States Patent
Huang et al.

(10) Patent No.: US 9,525,008 B2
(45) Date of Patent: Dec. 20, 2016

(54) RRAM DEVICES

(71) Applicants: National Taiwan University, Taipei (TW); Taiwan Semiconductor Manufacturing Company, Ltd., Hsin-Chu (TW)

(72) Inventors: Yi-Jen Huang, Hsin-Chu (TW); Samuel C. Pan, Hsin-Chu (TW); Si-Chen Lee, Taipei, TN (US)

(73) Assignees: Taiwan Semiconductor Manufacturing Company, Ltd., Hsin-Chu (TW); National Taiwan University, Taipei (TW)

(*) Notice: Subject to any disclaimer, the term of this patent is extended or adjusted under 35 U.S.C. 154(b) by 0 days.

(21) Appl. No.: 14/721,939

(22) Filed: May 26, 2015

(65) Prior Publication Data
US 2016/0293666 A1 Oct. 6, 2016

Related U.S. Application Data

(60) Provisional application No. 62/141,057, filed on Mar. 31, 2015.

(51) Int. Cl.
*H01L 45/00* (2006.01)
*H01L 27/24* (2006.01)

(52) U.S. Cl.
CPC ....... *H01L 27/2463* (2013.01); *H01L 45/1253* (2013.01); *H01L 45/146* (2013.01); *H01L 45/147* (2013.01); *H01L 45/16* (2013.01); *H01L 45/1233* (2013.01)

(58) Field of Classification Search
CPC ............. H01L 45/1233; H01L 45/1253; H01L 45/146; H01L 45/147; H01L 45/16; H01L 27/2463
See application file for complete search history.

(56) References Cited

U.S. PATENT DOCUMENTS

| | | | |
|---|---|---|---|
| 7,964,788 B2 * | 6/2011 | den Boer | H01L 31/02168 136/252 |
| 8,076,571 B2 * | 12/2011 | den Boer | H01L 31/02168 136/252 |
| 8,593,854 B1 | 11/2013 | Chih et al. | |
| 8,869,436 B2 | 10/2014 | Tsai et al. | |
| 8,993,397 B2 * | 3/2015 | Herner | H01L 45/148 257/E21.233 |
| 9,018,037 B1 * | 4/2015 | Nardi | H01L 45/08 257/2 |
| 9,281,475 B2 * | 3/2016 | Chang | H01L 45/1233 |
| 2005/0042460 A1 * | 2/2005 | Kriltz | B32B 17/10174 428/432 |
| 2011/0088762 A1 * | 4/2011 | Singh | H01L 31/03921 136/255 |

(Continued)

*Primary Examiner* — Nicholas Tobergte
(74) *Attorney, Agent, or Firm* — Slater Matsil, LLP

(57) ABSTRACT

Resistive random-access memory (RRAM) devices and methods of manufacturing thereof are disclosed. A device comprises a first transparent conducting oxide (TCO) layer and a second TCO layer over the first TCO layer. The device further comprises a first dielectric layer between the first TCO layer and the second TCO layer, a second dielectric layer between the second TCO layer and the first dielectric layer, and a metal layer between the first dielectric layer and the second dielectric layer.

20 Claims, 24 Drawing Sheets

(56) References Cited

U.S. PATENT DOCUMENTS

| | | | |
|---|---|---|---|
| 2011/0260602 A1* | 10/2011 | Lee | H01J 9/02 |
| | | | 313/491 |
| 2012/0132882 A1* | 5/2012 | Seo | H01L 27/12 |
| | | | 257/4 |
| 2013/0100577 A1* | 4/2013 | Popovici | H01L 28/40 |
| | | | 361/305 |
| 2013/0234094 A1 | 9/2013 | Chang et al. | |
| 2013/0336041 A1* | 12/2013 | Tsai | G11C 13/0002 |
| | | | 365/148 |
| 2014/0146593 A1 | 5/2014 | Tsai et al. | |
| 2014/0166961 A1 | 6/2014 | Liao et al. | |
| 2014/0175365 A1 | 6/2014 | Chang et al. | |
| 2014/0203236 A1 | 7/2014 | Chen et al. | |
| 2014/0264222 A1 | 9/2014 | Yang et al. | |
| 2014/0264233 A1 | 9/2014 | Tu et al. | |
| 2016/0064666 A1* | 3/2016 | Chan | H01L 45/145 |
| | | | 257/4 |

\* cited by examiner

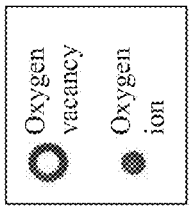
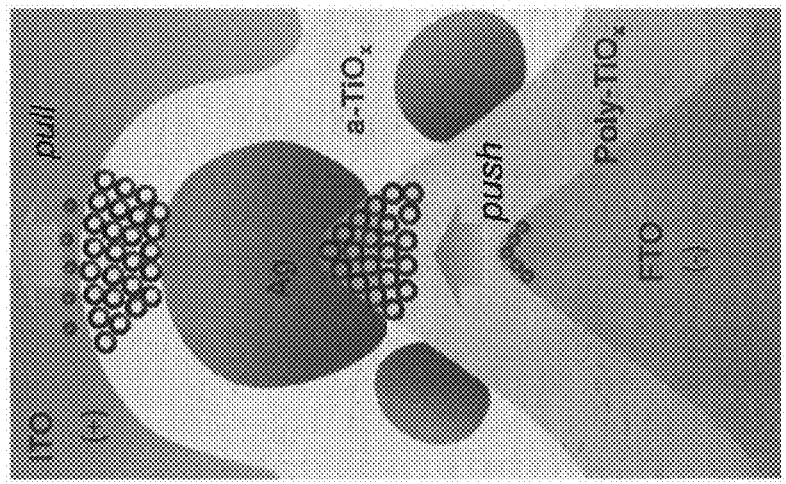
Fig. 20b
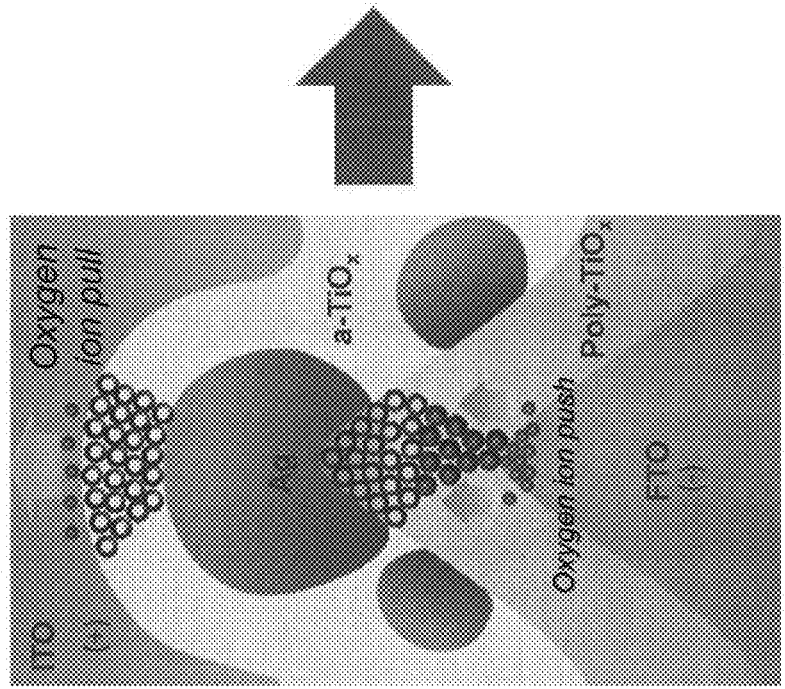
Fig. 20a

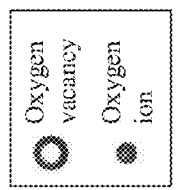
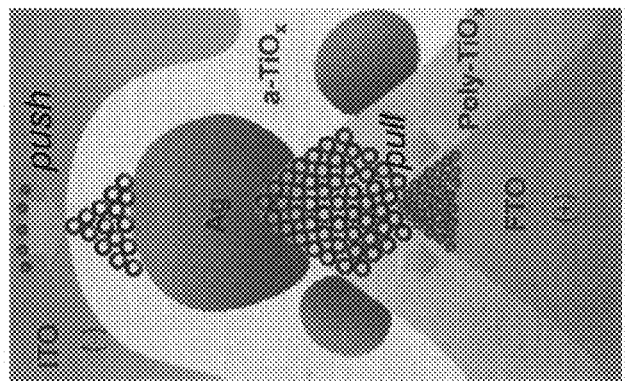
Fig. 22
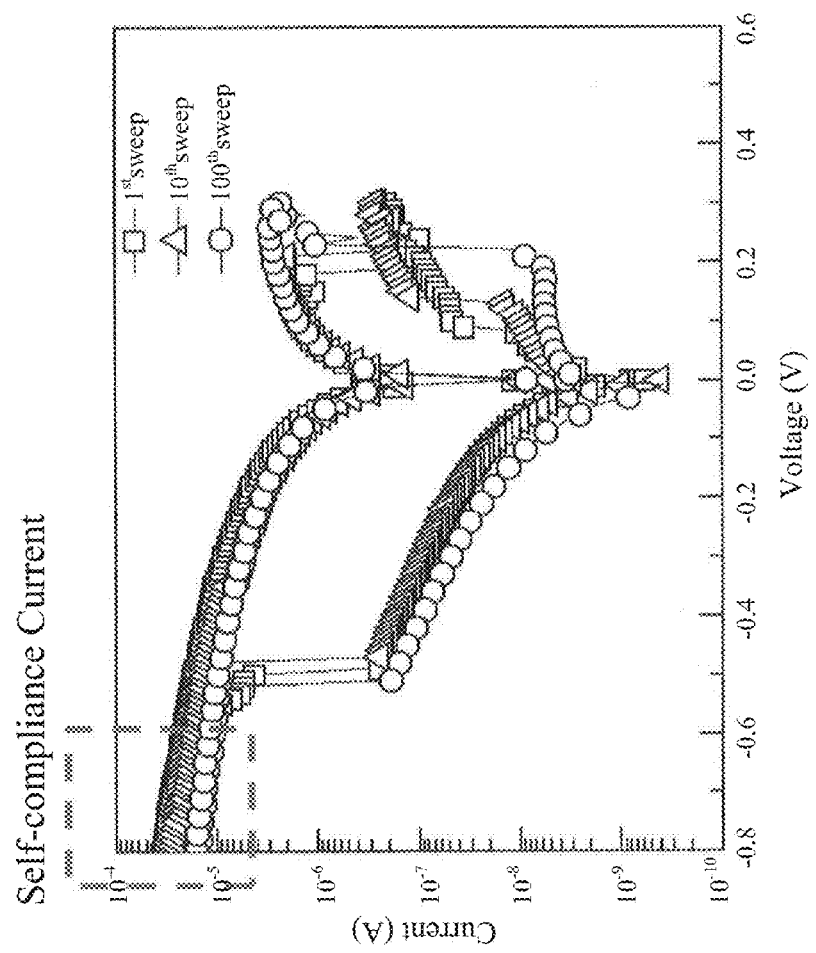
Fig. 21

RRAM DEVICES

PRIORITY CLAIM AND CROSS-REFERENCE

This application claims the benefit of the following provisionally filed U.S. patent application: Application Ser. No. 62/141,057, filed Mar. 31, 2015, and entitled "RRAM Devices and Methods of Manufacturing Thereof," which application is hereby incorporated herein by reference.

BACKGROUND

In integrated circuit (IC) devices, resistive random access memory (RRAM) is an emerging technology for next generation non-volatile memory devices. RRAM is a memory structure including an array of RRAM cells each of which stores one or more bits of data using resistance values, rather than electronic charge. Particularly, each RRAM cell includes a resistive material layer, the resistance of which can be adjusted to represent different logic values, e.g., logic "0" or logic "1." RRAM devices operate under the principle that a dielectric, which is normally insulating, can be made to conduct through a filament or conduction path formed after the application of a sufficiently high voltage. The forming of a filament or conduction path is the forming operation or forming process of the RRAM. The sufficiently high voltage is the 'form' voltage. The conduction path formation can arise from different mechanisms, including defect, metal migration, and other mechanisms. Various different dielectric materials may be used in RRAM devices. Once the filament or conduction path is formed, it may be "reset", i.e. broken, resulting in high resistance or "set", i.e. re-formed, resulting in lower resistance, by an appropriately applied voltage. There are various architectures to configure an array of RRAM cells. For example, a cross-point architecture includes a RRAM in each cell configured between a crossed word line and bit line. Recently, a transistor type architecture that pairs an RRAM with a transistor (1T1R) in each cell has been proposed that can improve random access time.

For random-access type memories, a 1T1R (one transistor, one resistor) architecture is well-suited because the transistor isolates current to cells that are selected from cells that are not. On the other hand, a cross-point architecture is more compact and may enable vertically stacking memory layers, suited for mass-storage devices. However, in the absence of any transistors, isolation must be provided by a "selector" device, such as a diode, in series with the memory element or by the memory element itself.

Research is being conducted to improve the performance of RRAM before its commercial utilization. There is a need for improving the performance of RRAM.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 17, 19 and 21 illustrate the current-voltage (I-V) characteristics of the RRAM device shown in FIG. 11, in some embodiments.

FIGS. 20a and 20b illustrate a principle of operation for the reset process of the RRAM device shown in FIG. 11, in some embodiments.

FIG. 22 illustrates a principle of operation for the self-compliance current of the RRAM device shown in FIG. 11, in some embodiments.

DETAILED DESCRIPTION

Figure 1:
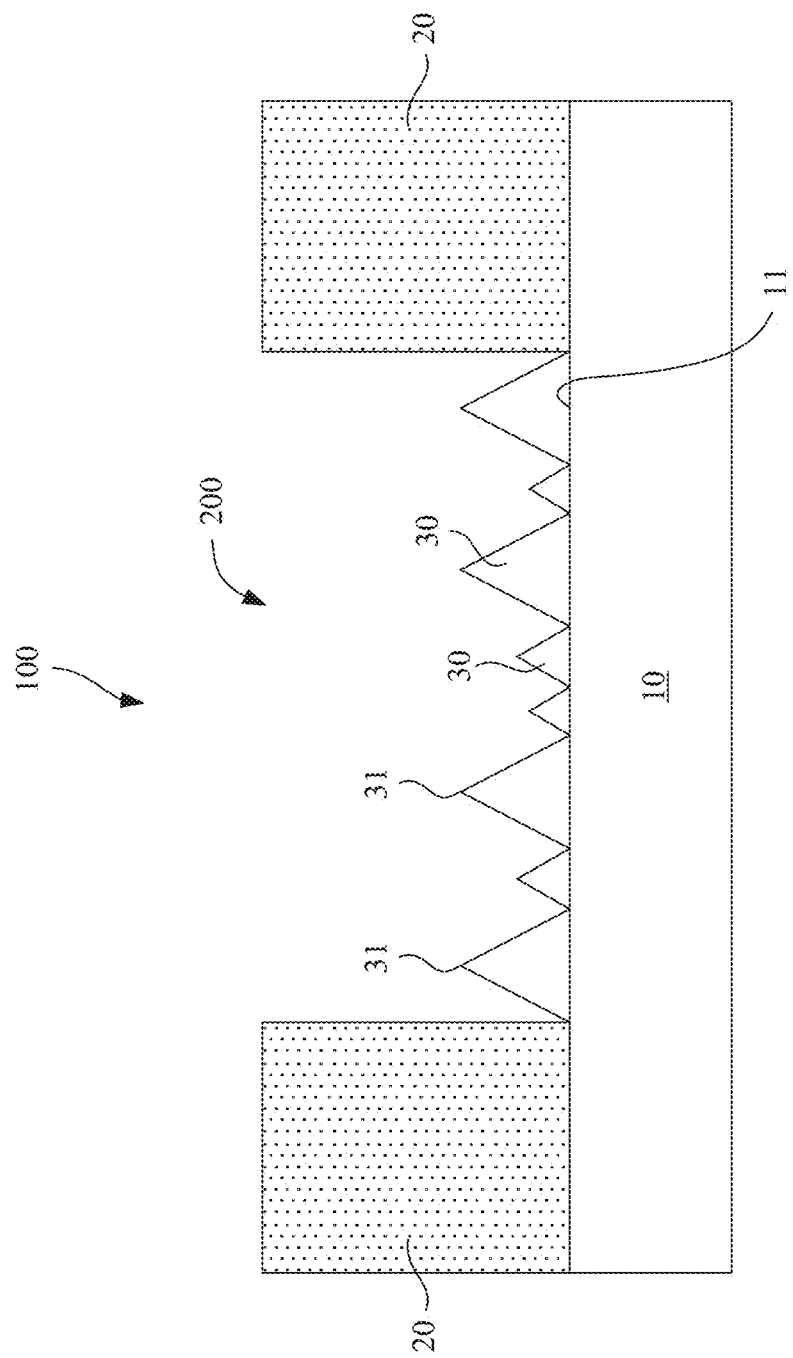
FIGS. 1-8 are cross-sectional views illustrating a method of fabricating an RRAM device at various stages in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s)

as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

RRAM devices and methods of fabricating RRAM devices are disclosed in the present disclosure. In some embodiments, an RRAM device has a stacked metal-insulator-metal (MIM) structure, with a plurality of conductive and dielectric layers between a top electrode and a bottom electrode. The disclosed device can be used as a memory device in some embodiments. In other embodiments, the disclosed device can be used as a threshold switching device. In accordance with some embodiments, the disclosed device operates in a push-pull manner (discussed in details hereafter), resulting in a self-compliance current for the RRAM device. The disclosed device could achieve a low operation voltage of less than 1 volt and a low operation current of less than 50 µA as a memory device, and could achieve a lower operation voltage of less than 1 volt and a low operation current of less than 20 µA as a threshold switching device, in some embodiments. The presently disclosed device could be used as RRAM devices or switching devices for 7-5 nm crossbar memory array applications, in some embodiments. In the discussion hereinafter, the disclosed device may be referred to as an RRAM device, regardless of what operation mode (e.g., a memory device or a threshold switching device) it may be in.

FIGS. 1-8 are cross-sectional views illustrating a method of fabricating an RRAM devices at various stages in accordance with some embodiments. Illustrated in FIG. 1 is a structure 100 comprising a bottom electrode 10, in some embodiments. The bottom electrode 10 may comprise Cu, Au, Pt, or other suitable conductive materials and may have a thickness from about 20 nm to about 30 nm, as examples. A transparent conducting oxide (TCO) layer 30 is formed on a portion of an upper surface 11 of bottom electrode 10, which portion is exposed by opening 200 formed in a sacrificial layer 20, in some embodiments. Sacrificial layer 20 may be or comprise photo resist, and opening 200 may be formed by a photolithography and etching process known in the art, in some embodiments. The TCO layer 30 may comprise indium tin oxide (ITO), fluorine doped tin oxide (FTO), Al-doped ZnO (AZO), $In_2O_3$, or $SnO_2$, in some embodiments. In accordance with an embodiment, a TCO layer 30 with a thickness from about 5 nm to about 10 nm is formed using deposition processes such as atomic layer deposition (ALD), chemical vapor deposition (CVD) or sputter, although other suitable deposition processes and combinations thereof may also be used.

Due to lattice mismatch between the TCO layer 30 and the underlying bottom electrode 10, the TCO layer 30 is textured, which texture is illustrated by a plurality of triangles of various sizes and shapes in the cross-sectional view of FIG. 1 (shown greatly exaggerated for purposes of illustration), in some embodiments. Skilled artisan will appreciate that the texture of TCO layer 30 may comprise other shapes in a cross-sectional view, such as domes or other irregular shapes with top portions 31 extending away from the bottom electrode 10. In some embodiments, the top portions 31 of TCO layer 30 may have a narrowing or pointed shape. In the embodiment shown in FIG. 1, TCO layer 30 has a plurality of pointed top portions 31 extending away from the bottom electrode 10. The textured TCO layer 30 provides many advantages. For example, the top portions 31 of TCO layer 30 are disposed closer to the top electrode 80 (see FIG. 8). The top portions 31's proximity to top electrode 80, combined with the fact that the top portions 31 are pointed, result in conductive paths or filaments being formed on the top portions 31 of TCO layer 30 (see FIG. 18, for example). Without limiting to any particular theory of operation, it is believed that the proximity to top electrode and the pointed shape of top portions 31 help to enhance the electrical field, at least proximate the conductive paths, thus is conducive to reducing the operation voltage of the RRAM device. In addition, the TCO layer 30 acts as an oxygen reservoir (e.g., providing or storing oxygen ions), which helps to improve the reliability of the RRAM device.

Figure 2:
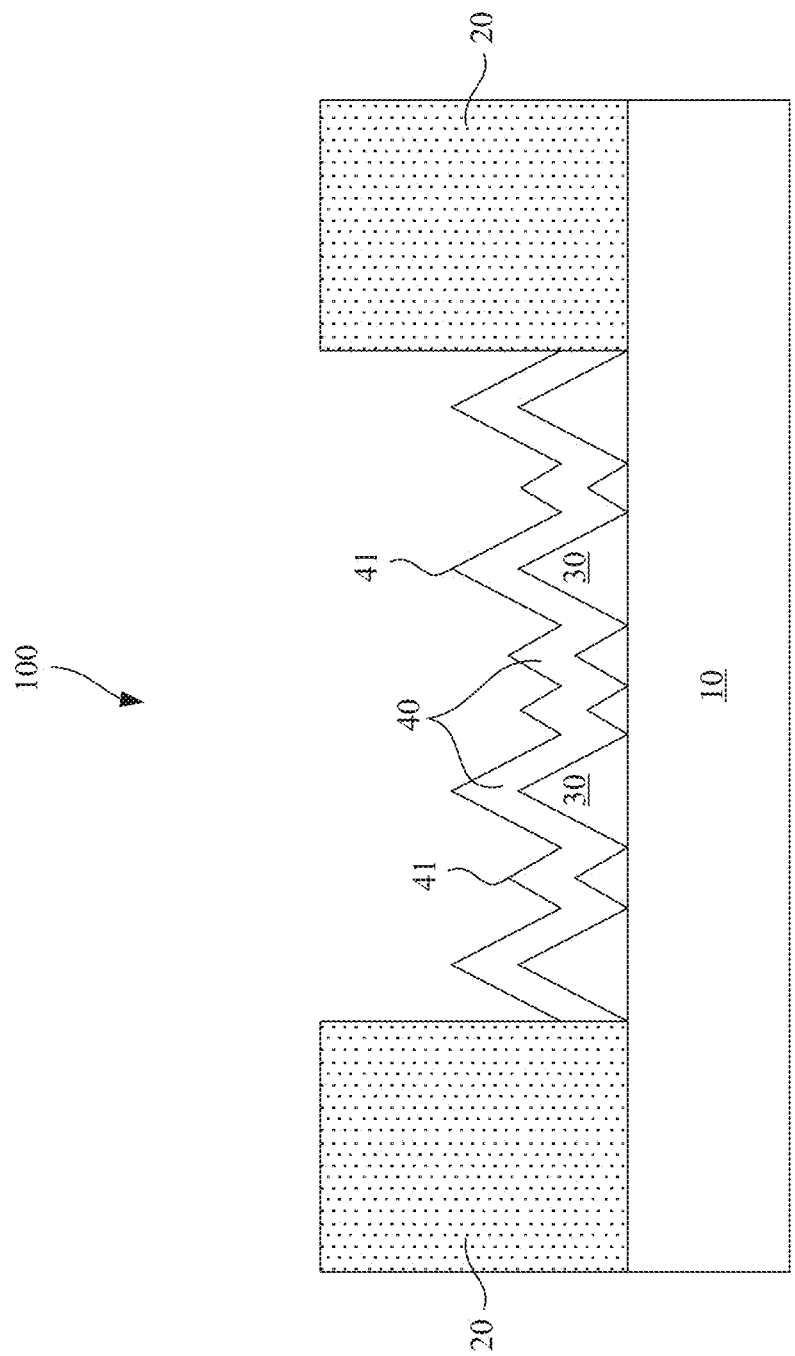

Next, as illustrated in FIG. 2, a dielectric layer 40, such as an oxide layer 40, is conformally formed on the textured TCO layer 30, in some embodiments. Due to the texture of the underlying TCO layer 30, dielectric layer 40 exhibits similar texture as the TCO layer 30 and has a plurality of top portions 41, in some embodiments. In accordance with some embodiments, the oxide layer 40 comprises a transition metal oxide. In accordance with an exemplary embodiment, layer 40 comprises amorphous TiOx. Deposition processes such as ALD may be used to grow, on the TCO layer 30, an amorphous TiOx layer 40 with a thickness from about 7 nm to about 10 nm, in some embodiments. In accordance with an embodiment, the value of x in the amorphous TiOx is in a range from about 1.5 to about 1.7, which indicates that the amorphous TiOx layer 40 contains a large number of oxygen vacancies. Besides TiOx, dielectric layer 40 may comprise other oxide or transition metal oxide, such as TaOx, HfOx, ZrOx, WOx, FeOx, SiOx, NiOx, NbOx, VOx, CuOx, AlOx, ZnOx, and GaOx, as examples. The discussion hereafter may refer to layer 40/45 as amorphous TiOx layer 40/polycrystalline TiOx layer 45, with the understanding that other suitable materials, such as those listed above, may also be used for layer 40/45.

Figure 3:
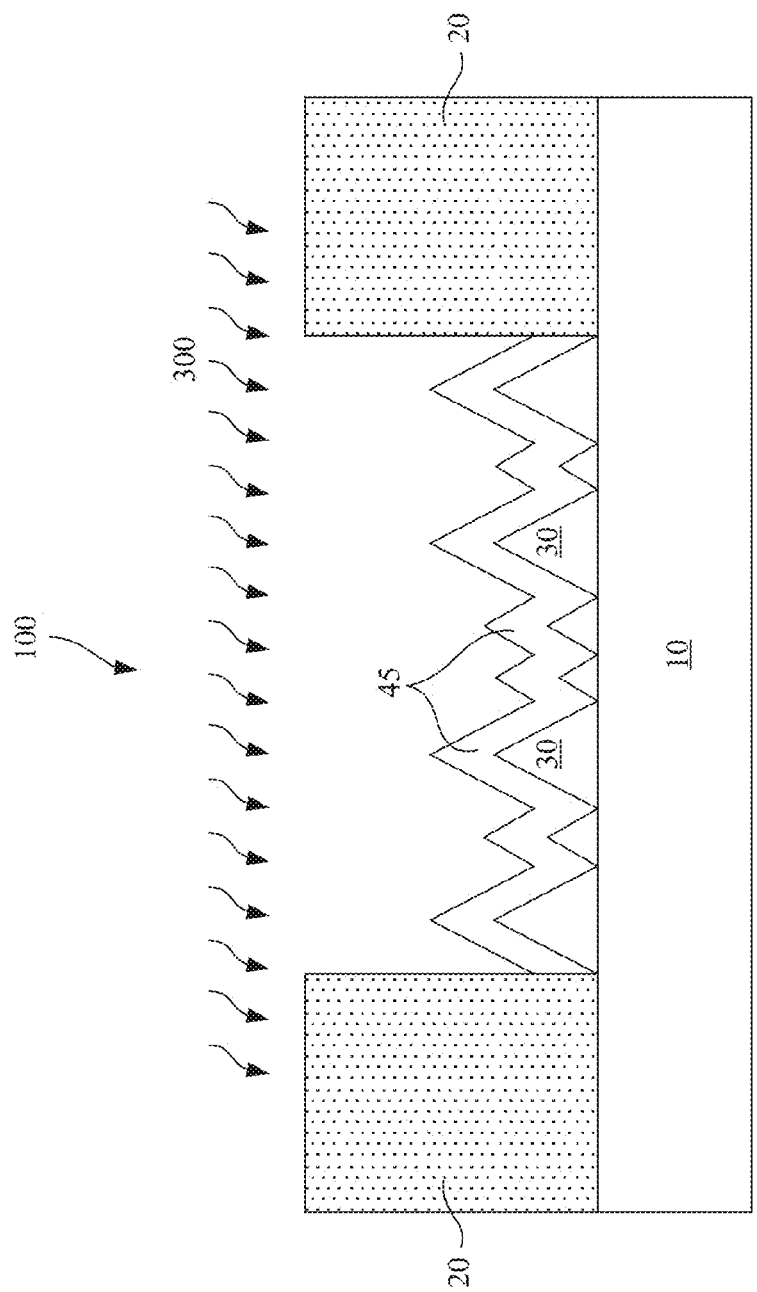

Next, a high temperature process 300 is performed on the structure 100, as illustrated in FIG. 3. In some embodiments, a rapid thermal anneal (RTA) process 300 is performed to transform the amorphous TiOx layer 40 into polycrystalline TiOx layer 45. The RTA process may be performed at a temperature greater than about 250° C., such as about 500° C., for less than about 30 minutes, such as about 5 minutes, in a gas ambient with $O_2$ or $N_2$, in some embodiments. In other embodiments, the high temperature process 300 may be a thermal anneal process performed at a temperature below about 700° C. for about one hour. In accordance with some embodiments, the x value of the polycrystalline TiOx is within a range between about 1.8 and about 1.95, which indicates that the polycrystalline TiOx layer 45 contains a small amount of oxygen vacancies.

Figure 4:
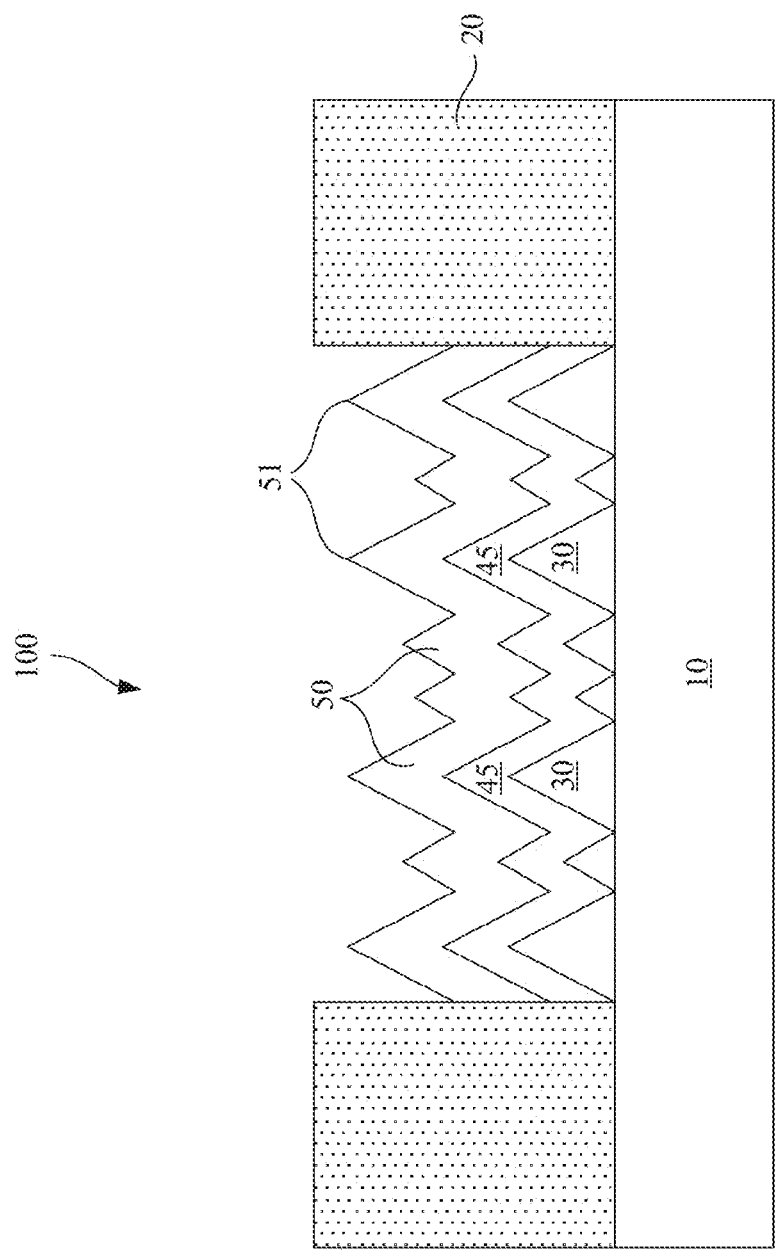

As illustrated in FIG. 4, a metal layer 50 with a thickness of, e.g., about 10 nm to 20 nm is formed on the polycrystalline TiOx layer 45 using thermal evaporator, E-gun (an electron beam evaporator manufactured by, e.g., Thermionics Laboratory Inc.) or other suitable methods or equipment. The evaporation process using E-gun or thermal evaporator may be performed at room temperature with a pressure of about $10^{-6}$ Torr, for example. In some embodiments, metal layer 50 comprises Ag, although other suitable metals (e.g., Cu, Au, and Pt) with high densities may also be used. The high density metal layer 50 may prevent diffusion of oxygen ion between the polycrystalline TiOx layer 45 and the subsequently formed amorphous TiOx layer 60 (see FIG. 5), in some embodiments. As shown in FIG. 4, metal layer 50 is conformal and shows similar texture (again greatly exaggerated) as the underlying polycrystalline TiOx layer 45 and comprises a plurality of top portions 51. Without limiting to any particular theory of operation, it is believed that the pointed top portions 51 may enhance the electric field and are conducive to reducing operation voltage of the RRAM device, for reasons similar to those discussed above regarding top portions 31 of the TCO layer 30, in accordance with some embodiments.

Figure 5:
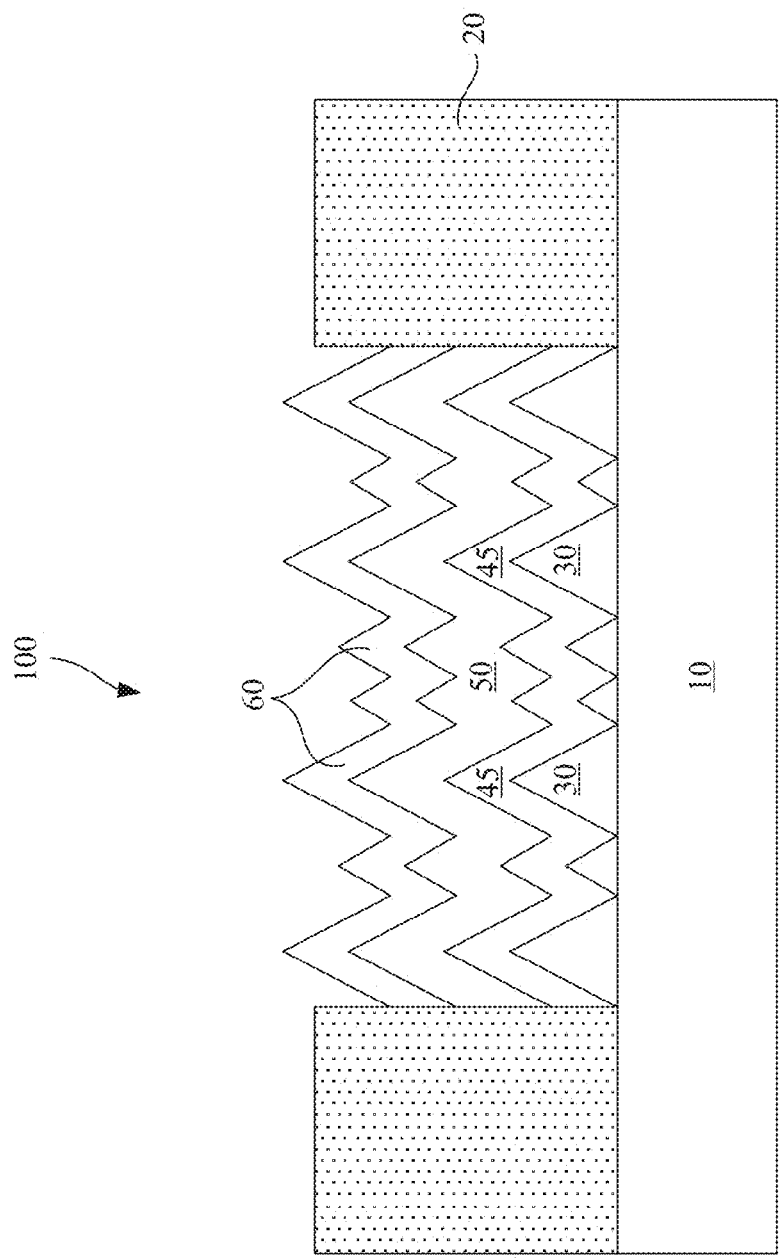

Next, as illustrated in FIG. 5, an amorphous TiOx layer 60 is conformally formed on the metal layer 50 by, e.g., an ALD process, in some embodiments. The amorphous TiOx layer has a thickness in a range from about 7 nm to about 10 nm and contains a large number of oxygen vacancies, in accordance with some embodiments. The composition of layer 60 is similar to that of layer 40 discussed above with reference to FIG. 2, and details are not repeated here for brevity.

Figure 6:
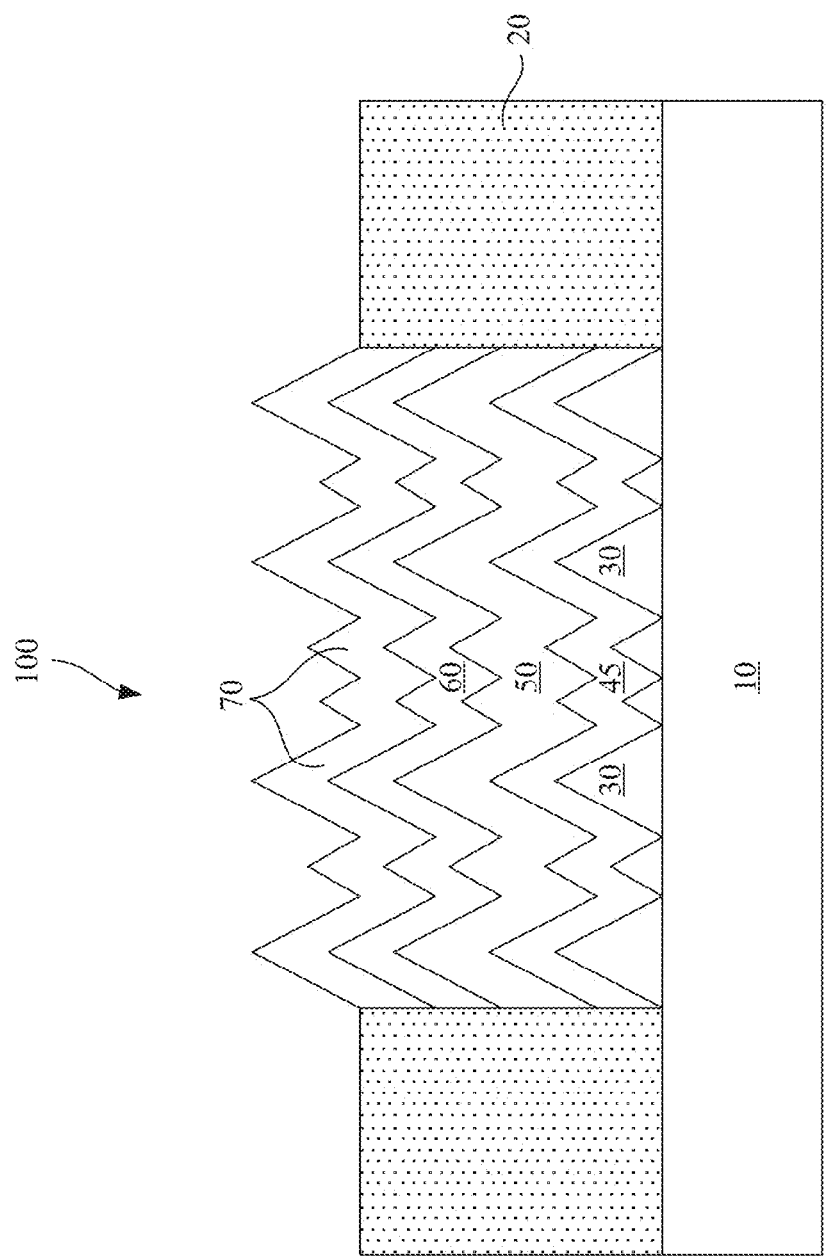

Next, as illustrated in FIG. 6, a second TCO layer 70 is deposited on the amorphous TiOx layer 60 using appropriate deposition methods such as ALD, CVD or sputter. In some embodiments, the TCO layer 70 is conformal and has a texture similar to the underlying layer 60 and comprises ITO, FTO, AZO, $In_2O_3$, or $SnO_2$. A thickness of the TCO layer 70 is in a range from about 5 nm to about 10 nm, as examples. Advantages offered by the TCO layer 70 include reduced operation voltage and improved reliability of the RRAM device, similar to those discussed above regarding TCO layer 30 with reference to FIG. 1.

Figure 7:
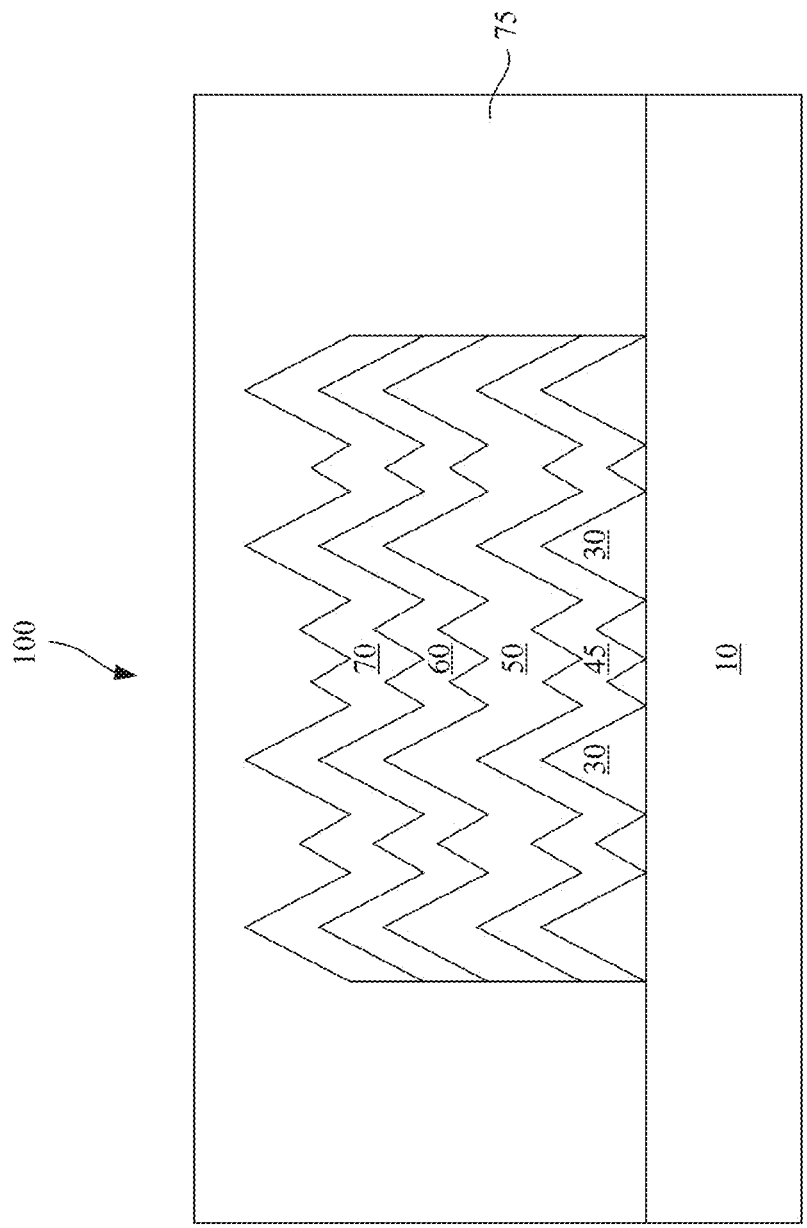

After the second TCO layer 70 is formed, sacrificial layer 20 is removed by, e.g., an etching processing or an ashing process (not shown), and an isolation dielectric layer 75 is formed over the bottom electrode 10 and the second TCO layer 70, as illustrated in FIG. 7. Isolation dielectric layer 75 may comprises, e.g., $SiO_2$ or $Si_3N_4$ formed by a suitable deposition process such as CVD, in some embodiments. In other embodiments, isolation dielectric layer 75 may comprise spin on glass (SOG) formed by, e.g., a spin-coating process. Isolation dielectric layer 75 isolates the bottom electrode 10 from the subsequently formed top electrode 80 (see FIG. 8) and prevents short circuit, in some embodiments.

Figure 8:
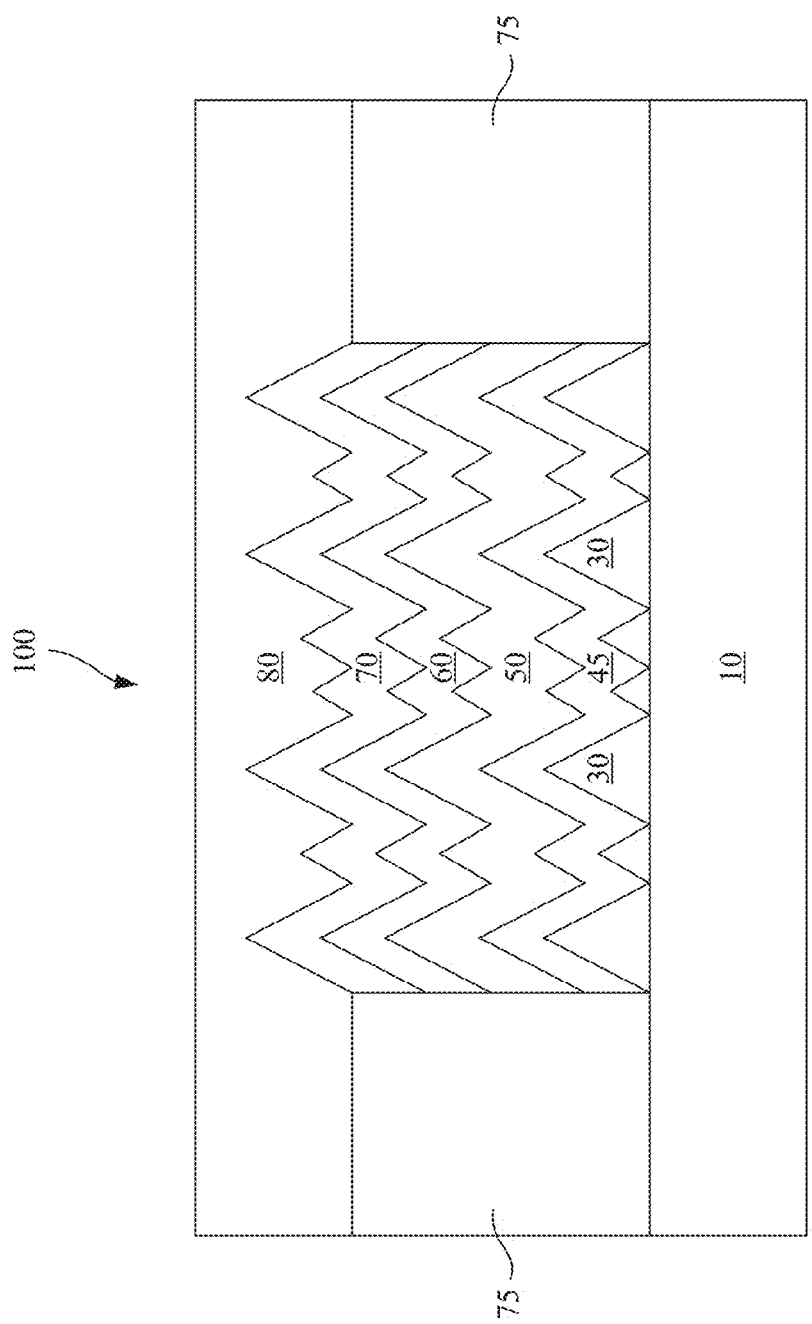
Figure 9A:
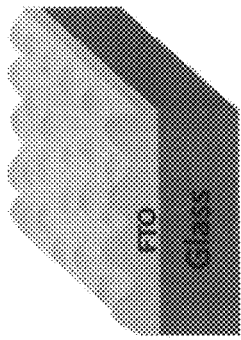
FIGS. 9a-9f are perspective views illustrating another method of fabricating an RRAM device, in accordance with various embodiments of the present disclosure.
Figure 9C:
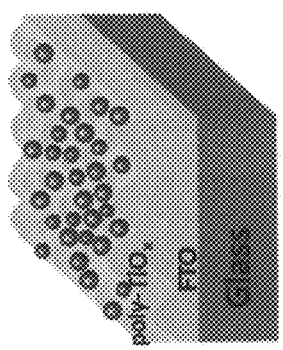
Figure 9E:
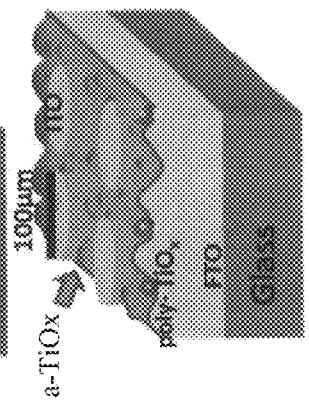
Figure 9B:
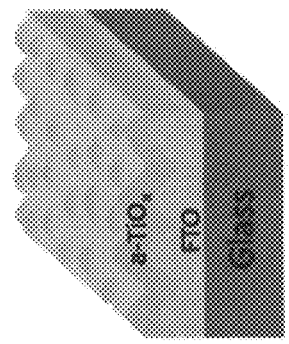
Figure 9D:
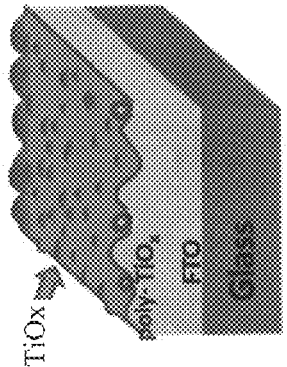
Figure 9F:
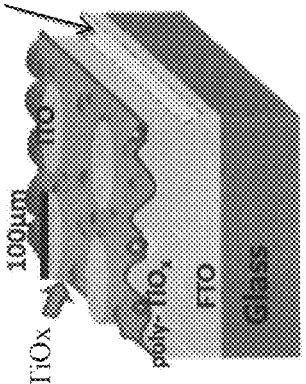

Next, as illustrated in FIG. 8, a top portion of isolation dielectric layer 75 is removed by, e.g., an etching process or a CMP process to expose the second TCO layer 70, and a top electrode 80 comprising Cu, Au, Pt or other suitable conductive materials is deposited over the second TCO layer 70 and the isolation dielectric layer 75 using deposition process such as physical vapor deposition (PVD), CVD, or other suitable methods. In FIG. 8, a top surface of the TCO layer 70 exhibits a texture. In other embodiments, the second TCO layer 70 may be planarized to obtain a planar upper surface before the top electrode 80 is formed (not shown). The top electrode 80 may have a thickness between about 20 nm to about 30 nm. A planarization process, such as a chemical mechanical planarization (CMP) process, may be performed to obtain a planar upper surface for the top electrode 80, in some embodiments.

The structure 100 shown in FIG. 8 illustrates an RRAM device of the present disclosure. In an embodiment, the RRAM device 100 comprises the following consecutively formed layers between the bottom electrode 10 and the top electrode 80: an FTO layer 30, a polycrystalline TiOx layer 45, an Ag layer 50, an amorphous TiOx layer 60, and an ITO layer 70.

FIG. 9 illustrates perspective views of an RRAM device at various stages of fabrication using another method, in accordance with various embodiments of the present disclosure. Referring to FIG. 9, step 9-*a*, a glass substrate with, e.g., an FTO layer coated on the upper surface of the glass substrate (hereafter FTO substrate) is provided, and an RCA cleaning process is performed to clean the FTO substrate, in some embodiments. In other embodiments, ITO, AZO, $In_2O_3$, or $SnO_2$ may be coated on the upper surface of the glass substrate. Hence the term FTO substrate may refer to a glass substrate coated with FTO or other suitable materials, such as those listed above. At step 9-*b*, an amorphous TiOx (a-TiOx) layer is formed on the FTO substrate. In some embodiments, the amorphous TiOx layer has a thickness between about 7 nm and about 10 nm. At step 9-*c*, metal particles are formed on the amorphous TiOx layer, and a high temperature process is performed subsequently to transform the amorphous TiOx into polycrystalline TiOx (poly-TiOx). In some embodiments, the metal particles comprise Ag nanoparticles formed by a thermal evaporation process, and the high temperature process comprises an RTA process performed at a temperature of about 500° C. in an $N_2$ ambient. At step 9-*d*, an amorphous TiOx layer is formed over the metal particles and the polycrystalline TiOx layer. The amorphous TiOx layer has a thickness between about 7 nm and about 10 nm, and is formed by, e.g., ALD, in some embodiments. At step 9-*e*, one or more top electrodes are formed on the amorphous TiOx layer. In some embodiments, the one or more top electrodes comprise, e.g., ITO and are deposited by, e.g., a sputter process. Other suitable materials, such as FTO, AZO, $In_2O_3$, or $SnO_2$, may also be used for the top electrodes. In accordance with an embodiment, the one or more top electrodes have a diameter of about 100 μm. At step 9-*f*, an etching process is performed to form the bottom electrode. In accordance with some embodiments, the etching process removes, from top to bottom, a portion of the following layers: the amorphous TiOx layer, the metal particles and the polycrystalline TiOx layer, to expose an underlying portion of, e.g., the FTO layer (see annotations in the figure of step 9-*f*). The exposed portion of the FTO layer is used as the bottom electrode, in some embodiments. After the processing in step 9-*f*, an RRAM device is fabricated as shown in the figure of step 9-*f*.

Figures 10A, 10B:
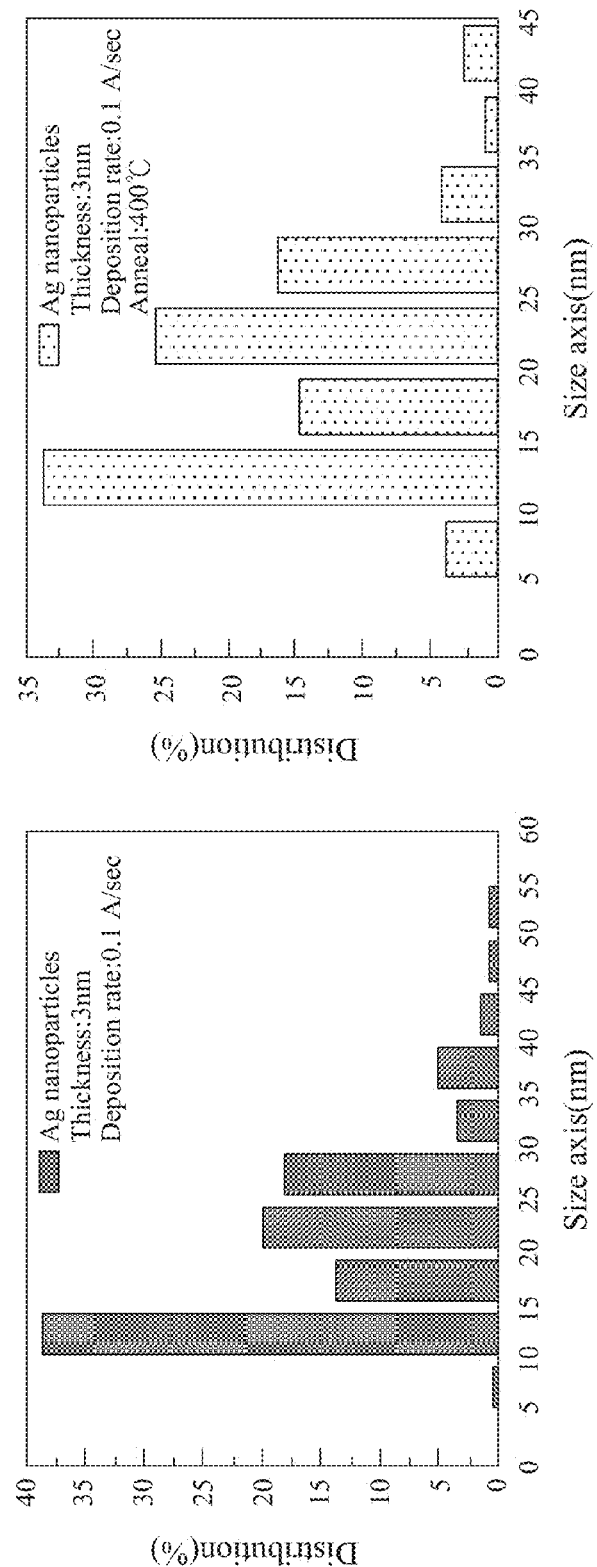
FIGS. 10a and 10b illustrate the size distributions of Ag nanoparticles before and after the anneal process performed in the step illustrated in FIG. 9c, in some embodiments.

FIGS. 10*a* and 10*b* illustrate the size distribution of Ag nanoparticles formed in step 9-*c* before and after the anneal process (e.g., the RTA process), respectively, in accordance with some embodiments. As illustrated in FIGS. 10*a* and 10*b*, there is an increase in the average size of the Ag nanoparticles after the anneal process (e.g., the RTA process).

Figure 12:
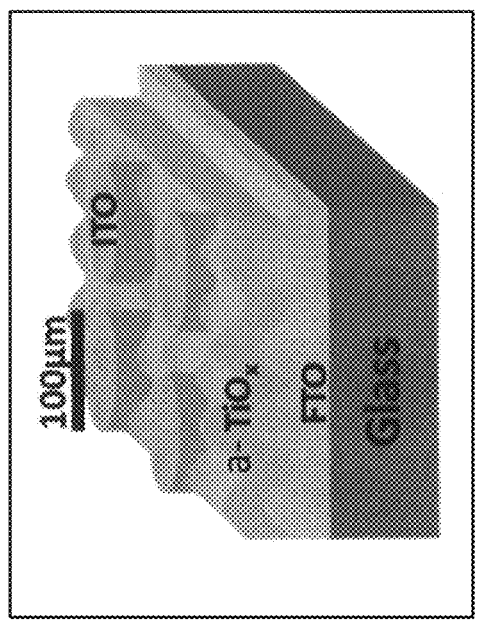
FIGS. 11 and 12 illustrate two RRAM devices used in a plurality of RRAM performance tests, in some embodiments.
Figure 11:
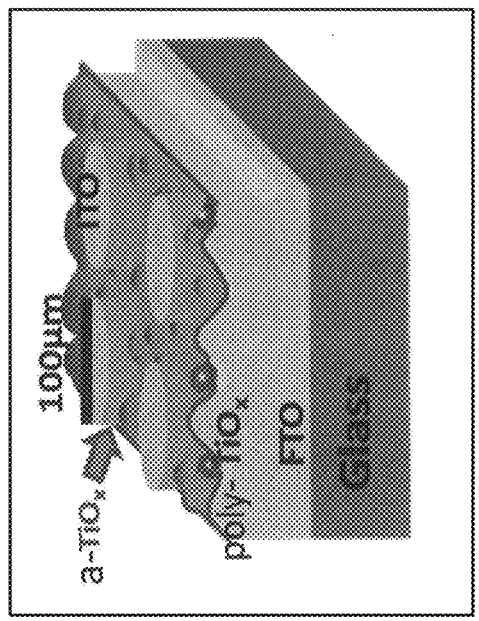

An RRAM device formed using the method illustrated in FIG. 9 is illustrated in FIG. 11. The RRAM device illustrated in FIG. 11 was used in a plurality of performance tests to characterize the performance of the RRAM device. Detailed results of the performance tests are discussed hereinafter. For comparison purpose, another RRAM device as shown in FIG. 12 was also built and tested along with the RRAM device in FIG. 11. The RRAM device illustrated in FIG. 12 comprises an amorphous TiOx layer between a top electrode (e.g., an ITO layer) and a bottom electrode (e.g., a FTO layer) and resembles conventional RRAM devices. Comparing the performance of the two RRAM devices shown in FIGS. 11 and 12 help to deepen the understanding of the working mechanism as well as the advantages of the presently disclosed RRAM device (e.g. devices illustrated in FIG. 11 and FIG. 8). In the discussions of the performance tests hereafter, the RRAM devices shown in FIGS. 11 and 12 may be referred to as RRAM device A and RRAM device B, respectively.

Figures 13A, 13B:
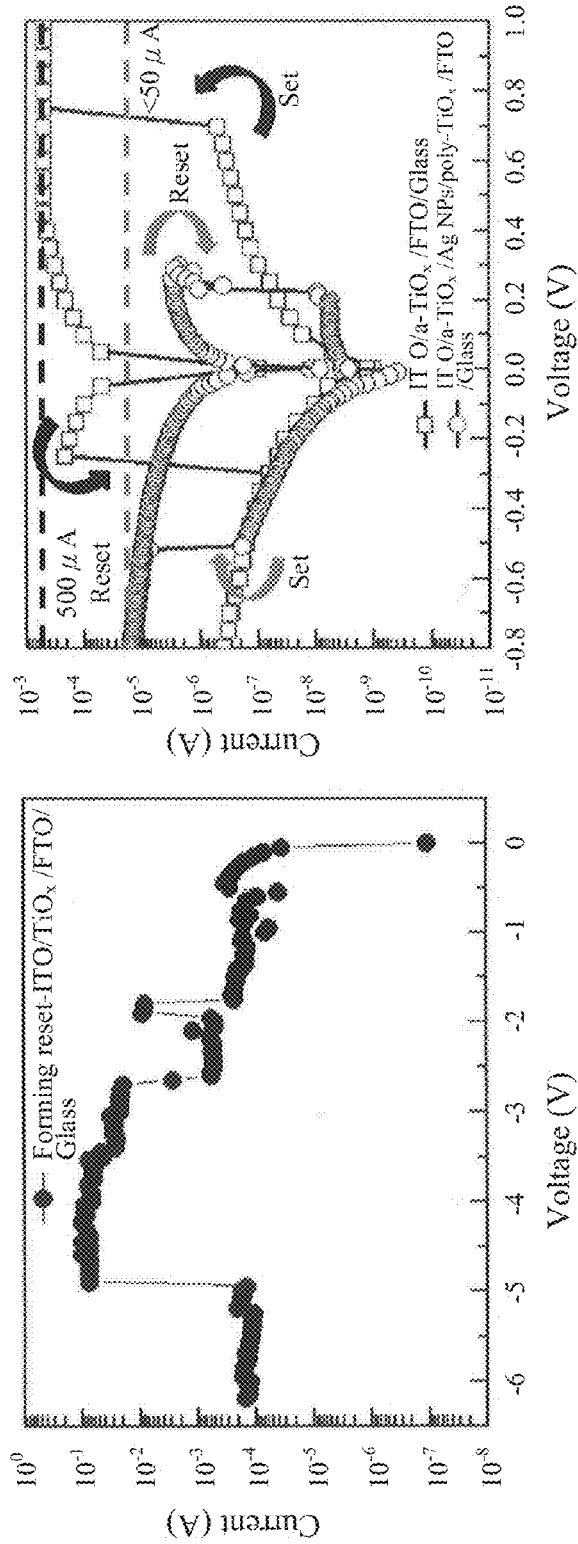
FIGS. 13a and 13b illustrate the memory electrical properties of the RRAM devices shown in FIGS. 11 and 12, in some embodiments.

FIGS. 13*a* and 13*b* illustrate the memory electrical properties of RRAM device A and B (e.g., RRAM device A functions as a memory device), in some embodiments. In particular, FIG. 13a shows the current-voltage (I-V) characteristics of the forming reset process of RRAM device B. As illustrated in FIG. 13a, RRAM device B has a negative forming reset voltage of about −5 volt. Due to its particular structure, RRAM device A does not need a forming process (i.e. forming-free), thus only the I-V characteristics for RRAM device B is plotted in FIG. 13a. Forming-free is a highly desirable feature for RRAM devices, since the forming process may require a higher voltage than the normal operation voltage. The higher voltage used in the forming process might degrade the memory endurance and damage the device. The presently disclosed RRAM device A offers performance advantage by being forming-free.

FIG. 13b shows the I-V characteristic of the set and reset processes for both RRAM device A and RRAM device B. As illustrated in FIG. 13b, RRAM device B has a positive set voltage around 0.7 volt, and a negative reset voltage around −0.3 volt. RRAM device A has a negative set voltage around −0.5 volt, and a positive reset voltage around 0.25 volt. While both RRAM device A and B exhibit self-compliance current and low operation voltage (e.g., less than 1 volt), RRAM device A has a lower operation current of less than about 50 μA, which is about 10 times better than the operation current of less than about 500 μA for RRAM device B. A lower operation current is desirable due to less power consumption, among other factors. The self-compliance current may prevent hard breakdown of the RRAM device and may obviate the need for external circuit used for limiting the current.

Figure 14B:
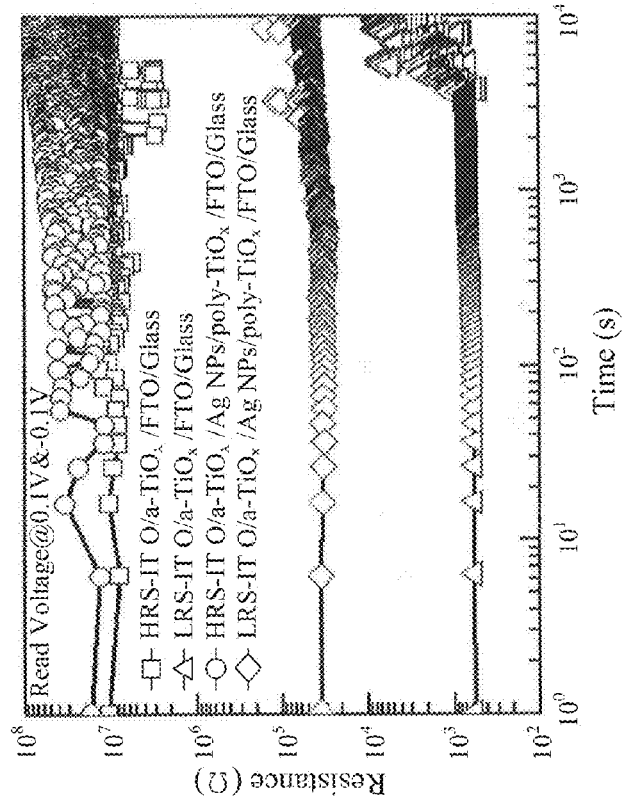
FIGS. 14a and 14b illustrate the memory endurance properties of the RRAM devices shown in FIGS. 11 and 12, in some embodiments.
Figure 14A:
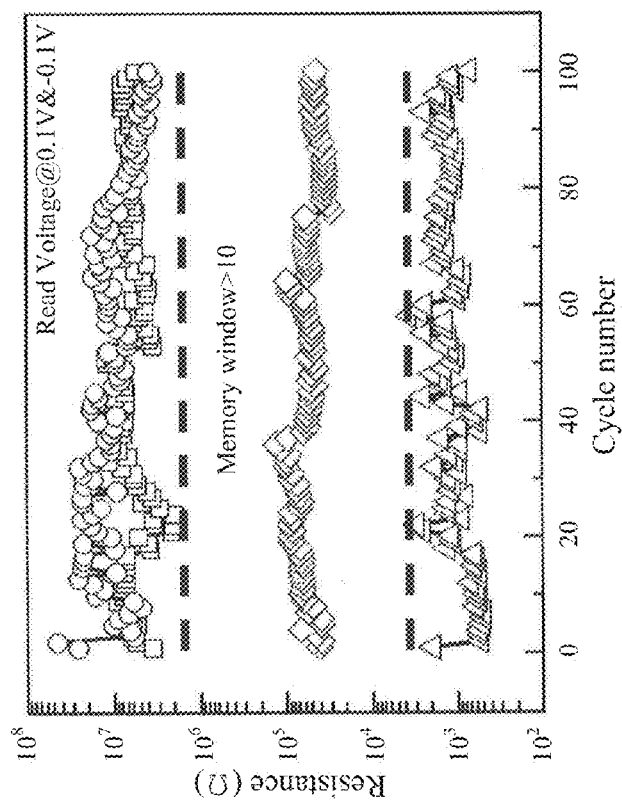

FIGS. 14a and 14b illustrate the memory endurance properties of RRAM device A and B, in some embodiments. The resistance of RRAM device A and B are read at 0.1 volt and −0.1 volt for the high resistance state (HRS) and low resistance state (LRS) of the devices. A DC mode sweep was performed for 100 cycles and the resistance of both RRAM device A and B are shown in FIG. 14a, which indicates that a memory window of larger than 10 is achieved for both devices. A retention test is performed in DC mode with read voltage of 0.1 volt and −0.1 volt, and the results are shown in FIG. 14b. As illustrated in FIG. 14b, retention time of larger than $10^4$ seconds is obtained for RRAM device A. The LRS curve for RRAM device A in FIG. 14b maintains more consistent values than that of the RRAM device B. Without limiting to any particular theory of operation, it is believed that the Ag nanoparticles can improve the reliability of retention time for RRAM device A.

Figure 15B:
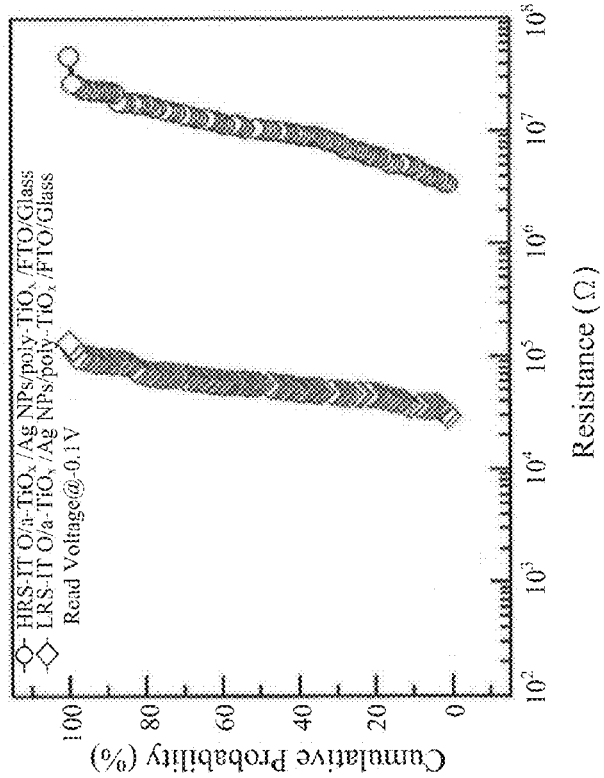
FIGS. 15a and 15b illustrate the distribution of resistance for the high resistance state (HRS) and the low resistance state (LRS) of the RRAM devices shown in FIGS. 11 and 12, in some embodiments.
Figure 15A:
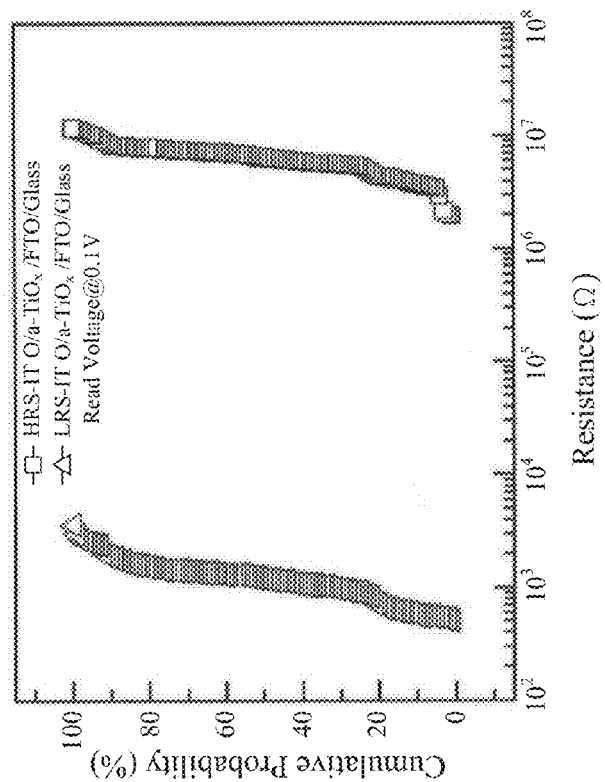

FIGS. 15a and 15b illustrate the distribution of the HRS resistance and the LRS resistance for RRAM device B and RRAM device A, respectively, in some embodiments. As illustrated in FIG. 15a, the HRS resistance of RRAM device B is in a range from about 2 MΩ to about 12 MΩ, and the LRS resistance of RRAM device B is in a range from about 500 MΩ to about 3500Ω. FIG. 15b shows that the HRS resistance of RRAM device A is in a range from about 3.4 MΩ to about 45 MΩ, and the LRS resistance of RRAM device A is in a range from about 0.03 MΩ to about 0.13 MΩ. As illustrated in FIGS. 15a and 15b, both RRAM device A and B exhibit a good uniformity of resistance states.

Figure 16B:
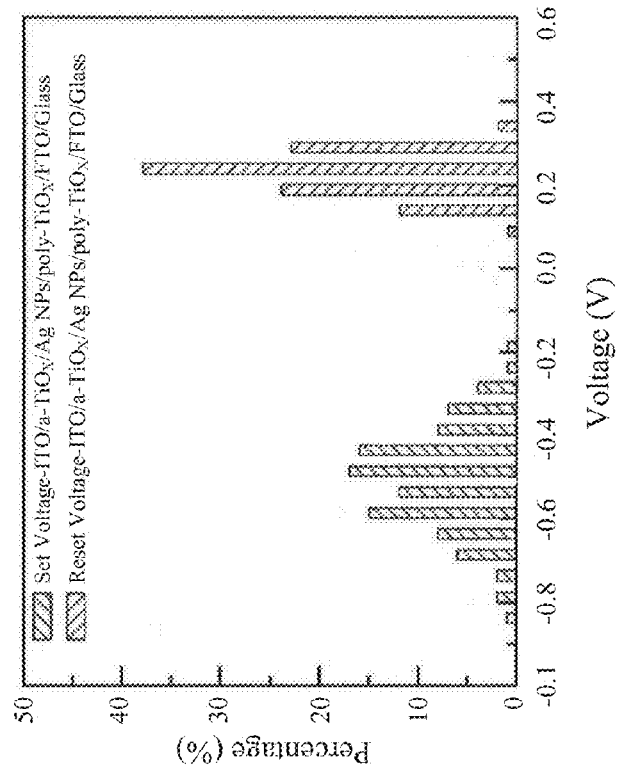
FIGS. 16a and 16b illustrate the distributions of the set voltage $V_{set}$ and reset voltage $V_{reset}$ of the RRAM devices shown in FIGS. 11 and 12, in some embodiments.
Figure 16A:
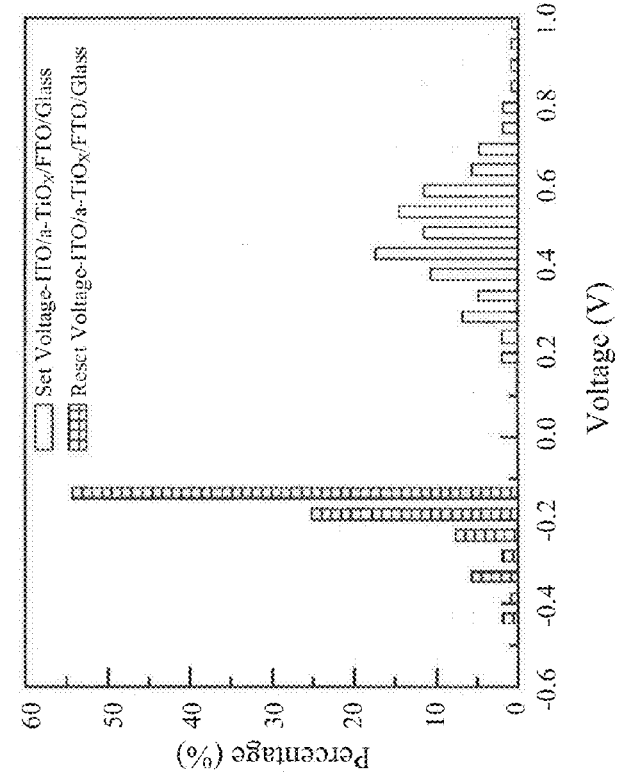

FIGS. 16a and 16b illustrates the distribution of the set voltage $V_{set}$ and reset voltage $V_{reset}$ of RRAM device B and RRAM device A, respectively, in some embodiments. As illustrated in FIG. 16a, the $V_{set}$ of RRAM device B is in a range from about 0.2 volt to about 0.9 volt, and the $V_{reset}$ of RRAM device B is in a range from about −0.15 volt to about −0.45 volt. FIG. 16b shows that the $V_{set}$ of RRAM device A is in a range from about −0.2 volt to about −0.85 volt, and the $V_{reset}$ of RRAM device A is in a range from about 0.1 volt to about 0.35 volt. As illustrated in FIGS. 16a and 16b, both RRAM device A and B exhibit a good uniformity of operation voltage.

Figure 17:
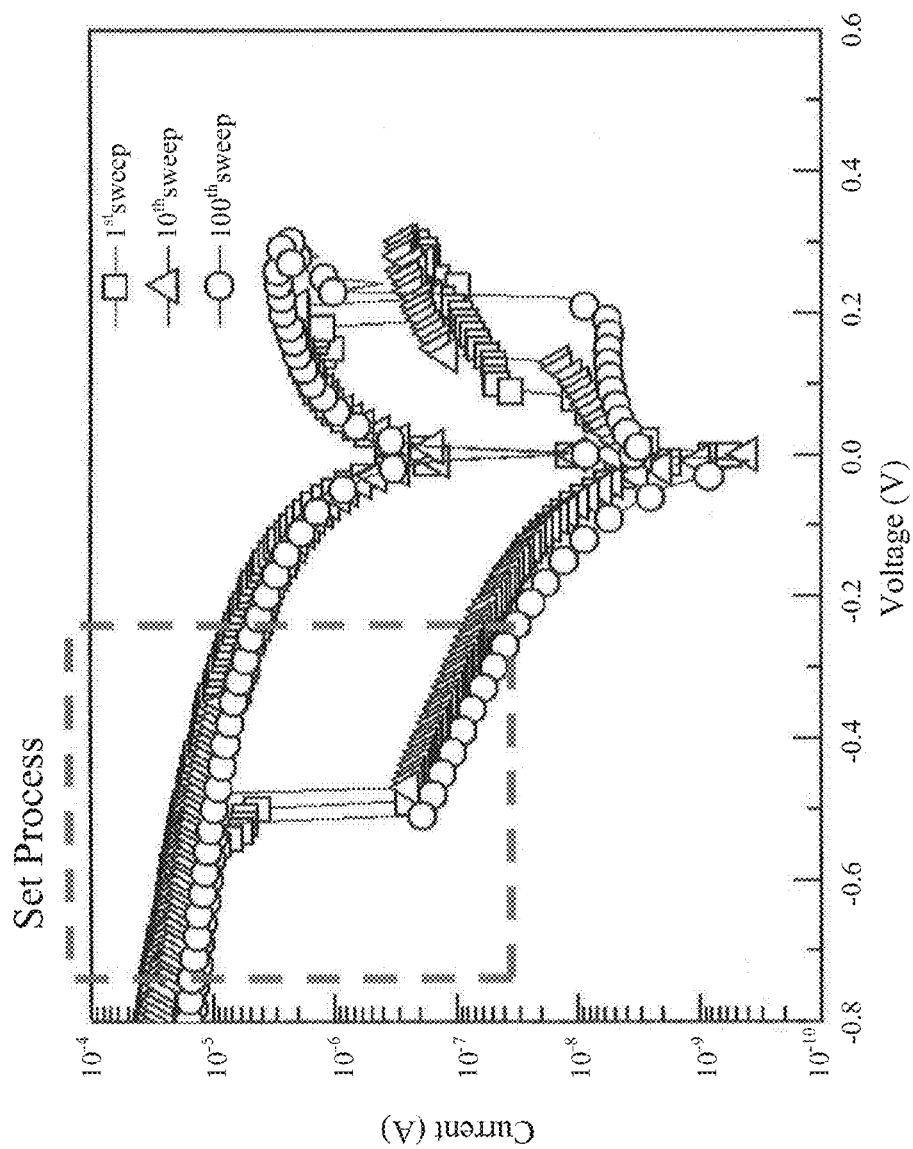

FIG. 17 illustrates the memory switching characteristics (e.g., I-V characteristics) of RRAM device A in the $1^{st}$, $10^{th}$ and $100^{th}$ sweep, respectively, in some embodiments. The dashed rectangle in FIG. 17 highlights the region of the I-V curves corresponding to the set process. A proposed principle of operation for the set process of RRAM device A can be explained by a push-pull mechanism discussed hereafter with reference to FIG. 18.

Figures 18A, 18B, 18C:
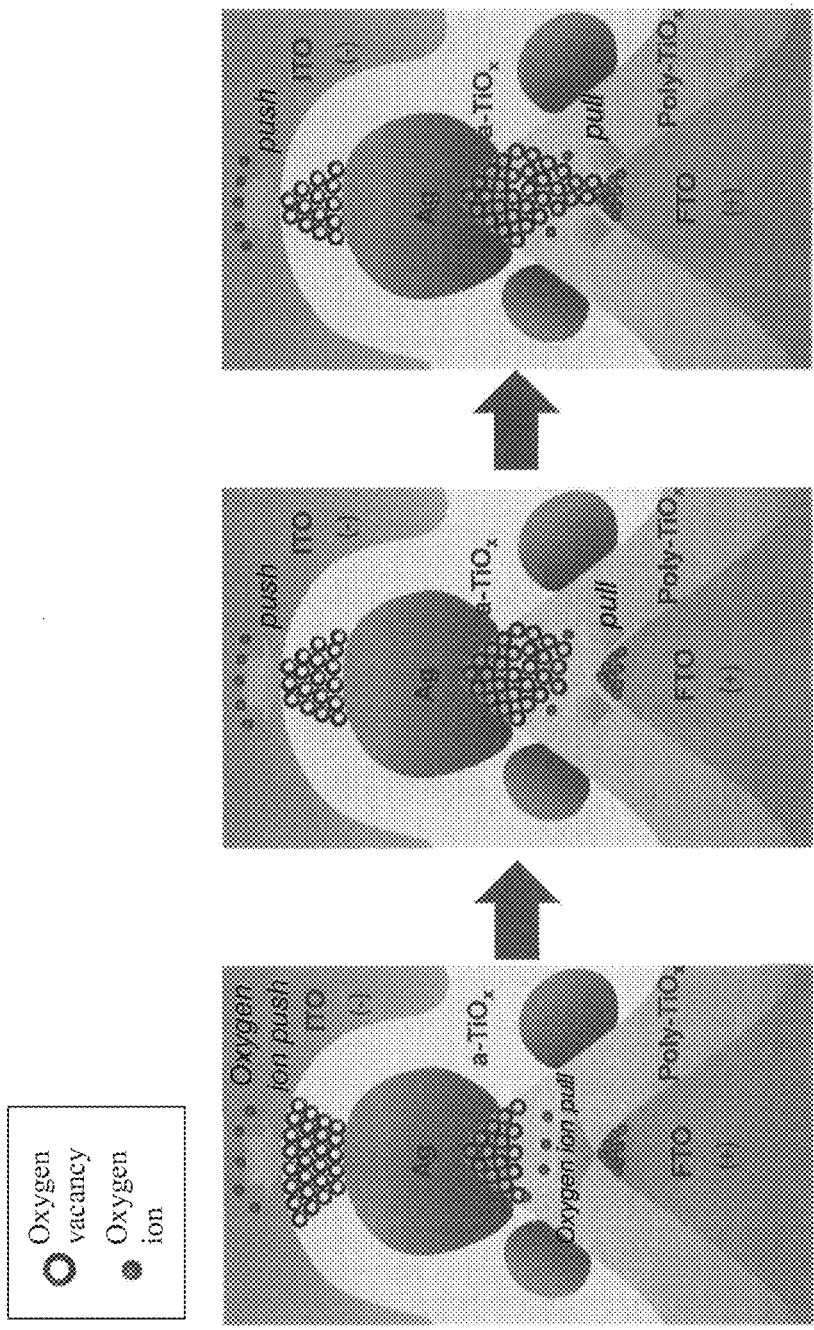
FIGS. 18a-18c illustrate a principle of operation for the set process of the RRAM device shown in FIG. 11, in some embodiments.

FIGS. 18a-18c illustrate a proposed principle of operation for the set process of RRAM device A, in some embodiments. As illustrated in the legend to FIG. 18, oxygen vacancies in the oxide layers (e.g., amorphous TiOx layer or polycrystalline TiOx layer) are represented by large hollow circles, and oxygen ions are represented by small sold circles. Referring to FIG. 18c, conductive paths or filaments between the top electrode (e.g., the ITO layer) and the bottom electrode (e.g., the FTO layer) comprise oxygen vacancies in the amorphous TiOx (a-TiOx) layer, the Ag nanoparticles, and oxygen vacancies in the polycrystalline TiOx (poly-TiOx) layer. As discussed before regarding the top portions 31 of TCO layer 30 with reference to FIG. 1, conductive paths tend to form on the pointed top portions of TCO layers (e.g., pointed top portions of FTO layer in FIG. 18).

Referring to FIG. 18a, at the beginning of the set process, the conductive path between the top electrode and the bottom electrode is broken due to a rupture in the oxygen vacancies in the poly-TiOx layer, which is caused by oxygen ions from the FTO layer combining with oxygen vacancies in the poly-TiOx layer. FIG. 18a also shows that no rupture of oxygen vacancies exists near the top electrode in the a-TiOx layer at the beginning of the set process. As the set process starts, a negative voltage is applied across RRAM device A, as illustrated in FIG. 18a. The negative voltage at the top electrode (e.g., the ITO layer in FIG. 18a) exerts a force to push away oxygen ions previously stored in the ITO layer into the a-TiOx layer. The positive voltage at the bottom electrode (e.g., the FTO layer in FIG. 18a) exerts a force to pull oxygen ions, which were previously combined with oxygen vacancies in the poly-TiOx layer, out of the poly-TiOx layer and into the FTO layer. Referring to FIG. 18b, as the top electrode pushes oxygen ions into the a-TiOx layer, the oxygen ions combine with the oxygen vacancies in the a-TiOx layer and reduce the amount of oxygen vacancies in the a-TiOx layer. On the other hand, the bottom electrode pulls oxygen ions previously combined with oxygen vacancies out of the poly-TiOx layer. As a result, the amount of oxygen vacancies in the poly-TiOx layer increases, and a conductive path comprising oxygen vacancies grows toward the bottom electrode. Referring to FIG. 18c, as the reset process progresses, a conductive path between the Ag nanoparticles and the FTO layer is formed, and there are still enough oxygen vacancies in the a-TiOx layer to maintain a conductive path between the ITO layer and the Ag nanoparticles, thus a complete conductive path from the top electrode to the bottom electrode is formed, and the RRAM device A completes the set process.

As illustrated above in FIGS. 18a-18c, the ITO layer and the FTO layer exerts opposite force to the oxygen ions, e.g., one pushes and the other pulls oxygen ions. The force of push and pull causes movement of the oxygen ions, which in turns causes conductive paths to form or rupture. This mechanism, referred to as push-pull mechanism, help to explain other behaviors of RRAM device A as well, as discussed below.

Figure 19:
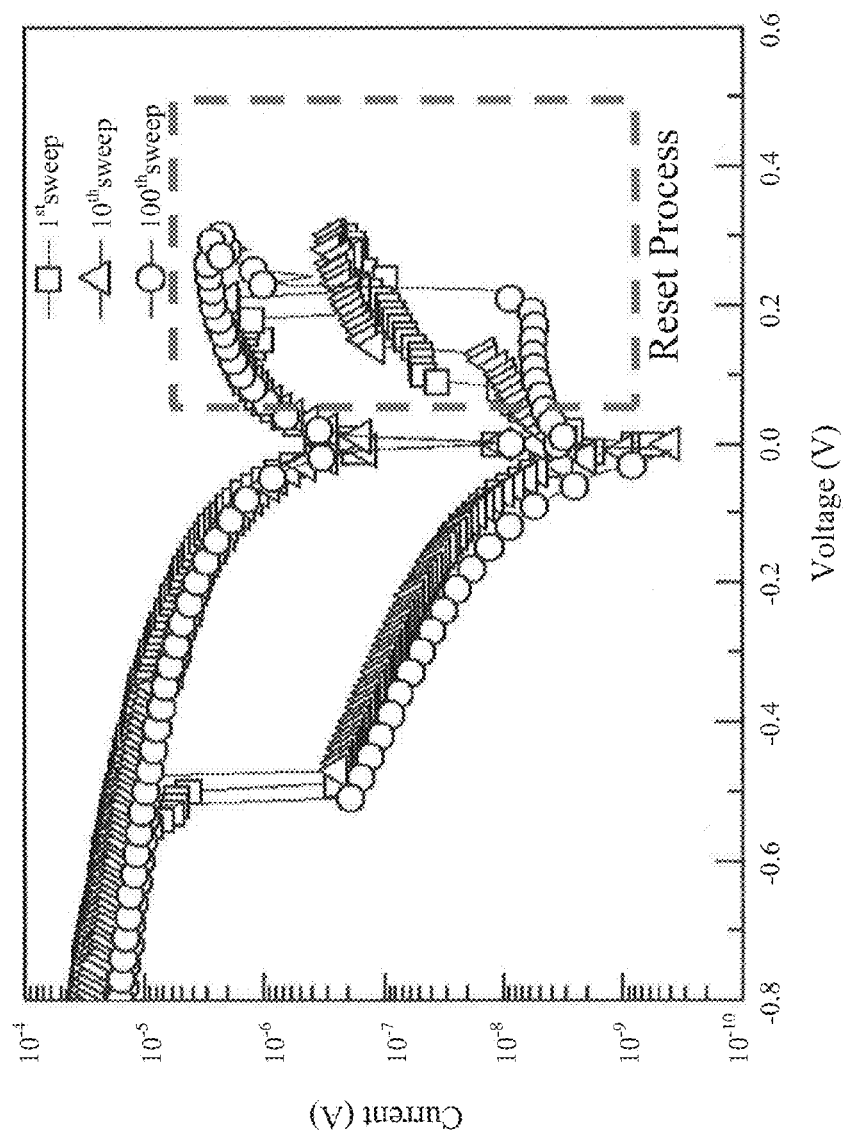

FIG. 19 illustrates the same I-V characteristics of RRAM device A as shown in FIG. 17. The dashed rectangle highlights the region of the I-V curves corresponding to the reset process. A proposed memory operation principle for the reset process of RRAM device A is explained below with reference to FIGS. 20a and 20b.

As illustrated in FIG. 20a, a positive voltage is applied across RRAM device A in a reset process. The positive voltage at the top electrode (e.g., the ITO layer in FIG. 20) pulls the oxygen ions out of the a-TiOx layer and into the ITO layer, while the negative voltage at the bottom electrode (e.g., the FTO layer in FIG. 20) pushes oxygen ions from the FTO layer into the poly-TiOx layer. The oxygen ions pushed into the poly-TiOx layer combine with oxygen vacancies and reduce the amount of oxygen vacancies in the poly-TiOx layer. Referring to FIG. 20b, when enough oxygen ions combine with oxygen vacancies, the conductive path between the Ag nanoparticles and the FTO layer ruptures, and the RRAM device A is reset.

FIG. 21 illustrates the same I-V characteristics of RRAM device A as shown in FIG. 17. The dashed rectangle highlights the self-compliance current behavior of RRAM device A. A proposed memory operation principle for self-compliance current of RRAM device A is explained below with reference to FIG. 22.

As illustrated in FIG. 22, after the set process, a conductive path exits between the top electrode (e.g., ITO in FIG. 22) and the bottom electrode (e.g., FTO in FIG. 22). As the magnitude of the negative voltage increases, more oxygen ions are pushed into the a-TiOx layer and combine with oxygen vacancies in the a-TiOx layer. As the amount of oxygen vacancies decreases, the resistance of the conductive path between the ITO layer and the Ag nanoparticles increases. The increased resistance counteracts the effect of increased magnitude of the negative voltage, thus limiting the current flowing through the RRAM device A.

Figure 23:
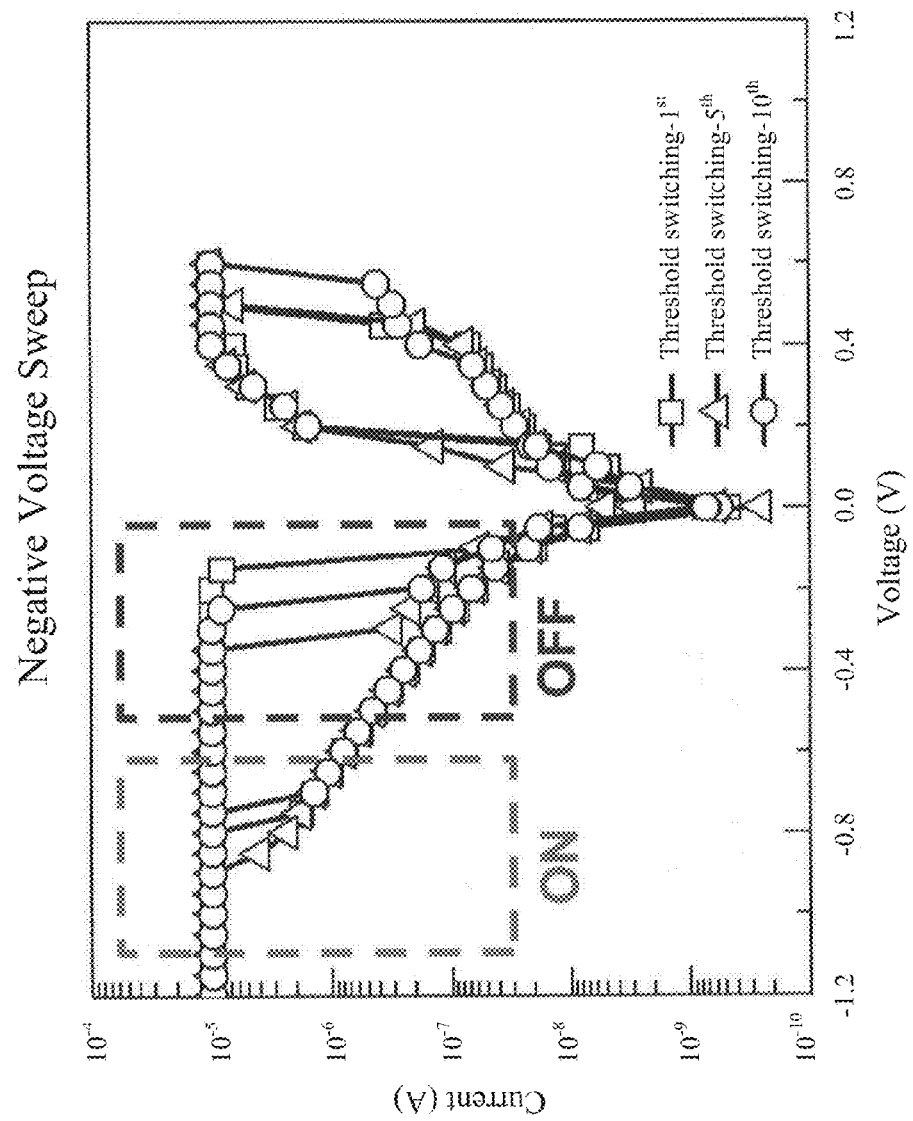
FIGS. 23 and 25 illustrate the threshold switching properties of the RRAM device shown in FIG. 11, in some embodiments.

FIG. 23 illustrates the threshold switching properties of RRAM device A, when RRAM device A operates as a threshold switching device, in some embodiments. Three sets of curves corresponding to the $1^{st}$, $5^{th}$ and $10^{th}$ sweep are shown in FIG. 23. As illustrated in FIG. 23, in a negative voltage sweep, the RRAM device switches to the ON state at a voltage between about −0.7 volt to about −0.9 volt, and the RRAM device switches to the OFF state at a voltage between about −0.1 volt to about −0.3 volt. The two dashed rectangles highlight the ON and OFF region, respectively, in a negative voltage sweep. The push-pull mechanism is used again to explain the threshold switching behavior with reference to FIG. 24.

Figures 24A, 24B:
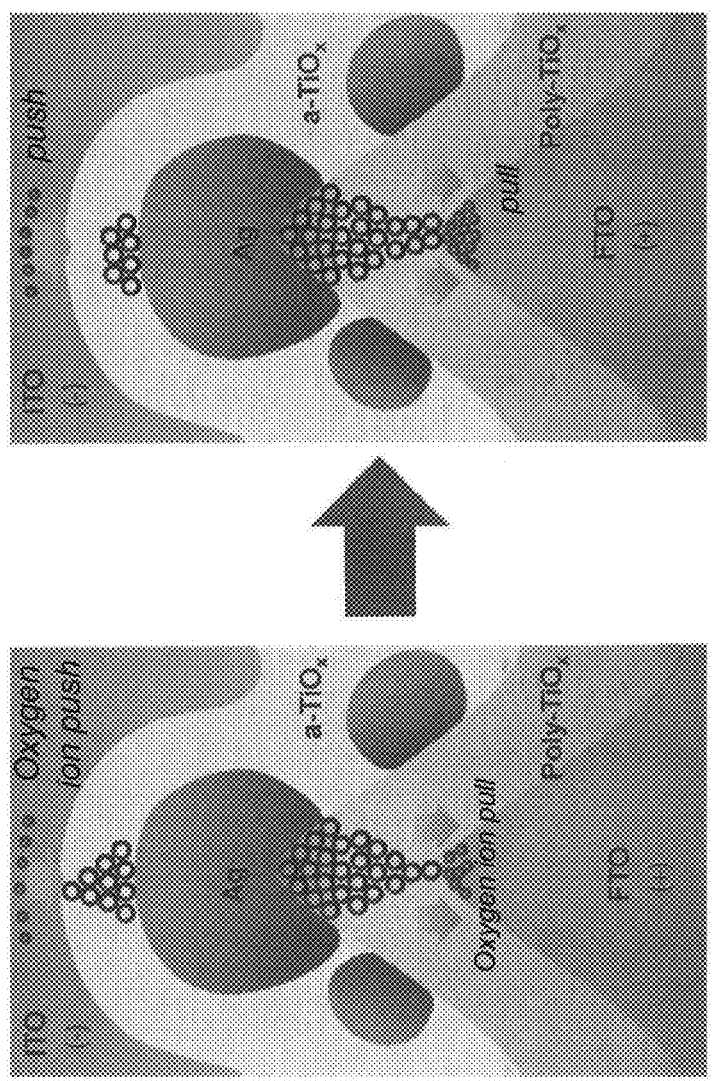
FIGS. 24a and 24b illustrate a principle of operation for the RRAM device shown in FIG. 11 in a negative voltage sweep, in some embodiments.

FIG. 24a illustrates the RRAM device A operating in the ON state of a negative voltage sweep, in some embodiments. As illustrated in FIG. 24a, a negative voltage is applied across RRAM device A. The positive voltage at the FTO layer pulls oxygen ions out of the poly-TiOx layer, increasing the amount of oxygen vacancies in the poly-TiOx layer. On the other hand, the negative voltage at the ITO layer pushes oxygen ions out of the ITO layer and into the a-TiOx layer, and the oxygen ions combine with oxygen vacancies in the a-TiOx layer, reducing the oxygen vacancies in the a-TiOx layer. As more and more oxygen ions combine with oxygen vacancies in the a-TiOx layer, a rupture of the conductive path in the a-TiOx layer occurs, and RRAM device A enters the OFF state, as illustrated in FIG. 24b.

Figure 25:
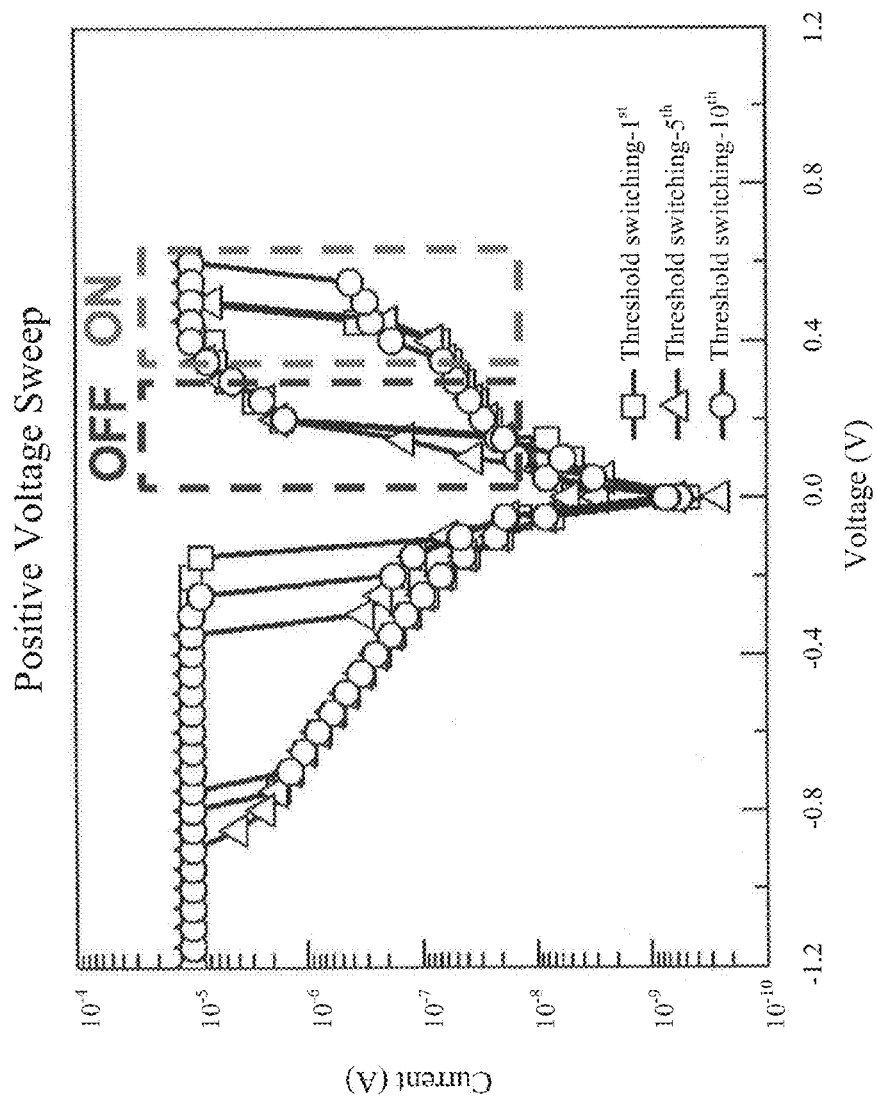

FIG. 25 illustrates the same threshold switching properties of RRAM device A as shown in FIG. 23, with the two dashed rectangles highlighting the ON and OFF region in a positive voltage sweep, respectively. As illustrated in FIG. 25, in a positive voltage sweep, the RRAM device switches to the OFF state at a voltage between about 0.1 volt to about 0.2 volt, and the RRAM device switches to the ON state at a voltage between about 0.4 volt to about 0.6 volt. The push-pull mechanism is used again to explain the threshold switching behavior with reference to FIG. 26.

Figures 26A, 26B:
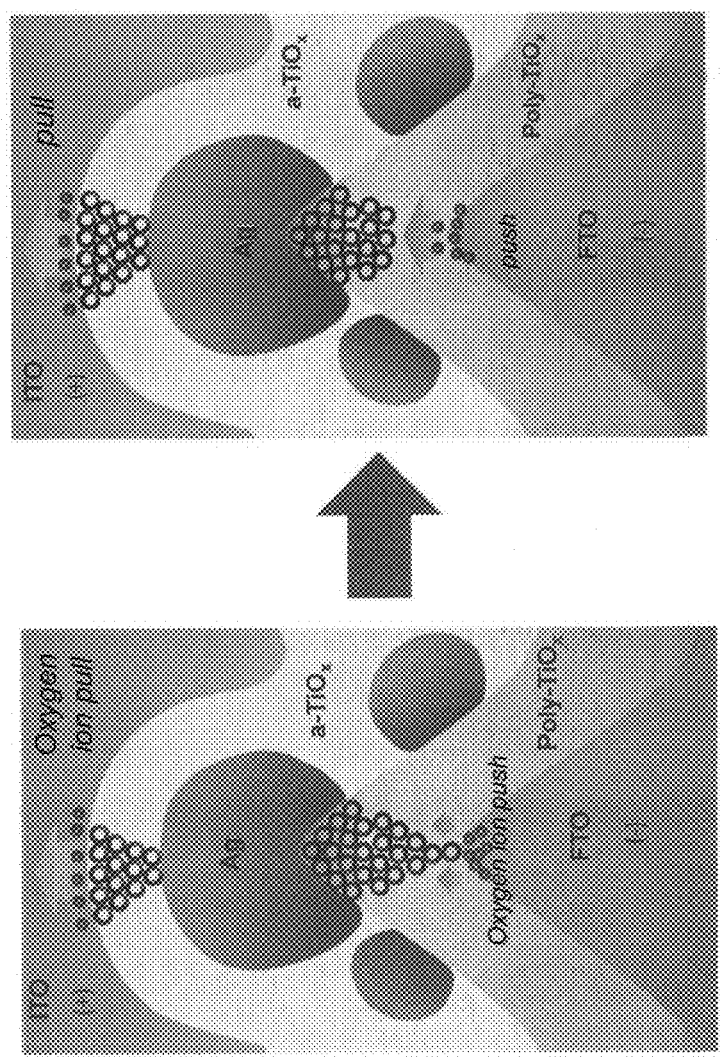
FIGS. 26a and 26b illustrate a principle of operation for the RRAM device shown in FIG. 11 in a positive voltage sweep, in some embodiments.

FIG. 26a illustrates the RRAM device A operating in the ON state of a positive voltage sweep. As illustrated in FIG. 26a, a positive voltage is applied across RRAM device A. The positive voltage at the ITO layer pulls oxygen ions out of the a-TiOx layer, increasing the amount of oxygen vacancies in the a-TiOx layer. On the other hand, the negative voltage at the FTO layer pushes oxygen ions out of the FTO layer and into the poly-TiOx layer. Oxygen ions combine with oxygen vacancies in the poly-TiOx layer, reducing the oxygen vacancies. As more and more oxygen ions combine with oxygen vacancies in the poly-TiOx layer, a rupture of the conductive path in the poly-TiOx layer occurs, and the RRAM device A enters the OFF state, as illustrated in FIG. 26b.

Embodiments of the device and methods in the current disclosure have many advantages. For example, the RRAM device disclosed in the present disclosure may be used as a memory device or a threshold switching device. The disclosed RRAM device has ultra-thin dielectric layers (e.g., about 10 nm for the a-TiOx layer and the poly-TiOx layer). When functioning as a memory device, no forming process is needed for the disclosed RRAM device, thus avoiding a high voltage process that may degrade the memory endurance and damage the device. Low operation voltage (e.g. <1V) and low operation current (e.g. <50 µA) can be achieved, which help to reduce the power consumption of the device. The disclosed RRAM device has a self-compliance current, which helps to avoid memory hard breakdown. The self-compliance current also obviates external circuit designed to limit current. When functioning as a selector device, the presently disclosed device achieves low operation voltage (e.g., <1V) and low operation current (e.g., <20 µA), which not only reduces device power consumption, but also makes it possible to integrate the disclosed device with memory devices.

In some embodiments, a device comprises a first TCO layer and a second TCO layer over the first TCO layer. The device further comprises a first dielectric layer between the first TCO layer and the second TCO layer, a second dielectric layer between the second TCO layer and the first dielectric layer, and a metal layer between the first dielectric layer and the second dielectric layer.

In other embodiments, an RRAM device comprises a bottom electrode, a top electrode over the bottom electrode, and a metal layer between the top electrode and the bottom electrode. The RRAM device further comprises a first dielectric layer between the bottom electrode and the metal layer, and a second dielectric layer between the top electrode and the metal layer.

In yet another embodiment, a method of forming an RRAM device comprises forming a first oxide layer over a first TCO layer, forming a metal layer over the first oxide layer, forming a second oxide layer over the metal layer, and forming a second TCO layer over the second oxide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first transparent conducting oxide (TCO) layer;
   a second TCO layer over the first TCO layer;
   a first dielectric layer between the first TCO layer and the second TCO layer;
   a second dielectric layer between the second TCO layer and the first dielectric layer;
   a metal layer between the first dielectric layer and the second dielectric layer;
   a fist conductive layer underlying the first TCO layer; and
   a second conductive layer overlying the second TCO layer.

2. The device of claim 1, wherein each of the first and second TCO layers comprises a material selected from the group consisting of indium tin oxide (ITO), fluorine doped tin oxide (FTO), Al-doped ZnO (AZO), $In_2O_3$, and $SnO_2$.

3. The device of claim 1, wherein a cross-sectional view of the first TCO layer comprises a texture.

4. The device of claim 3, wherein cross-sectional views of the first dielectric layer, the metal layer, and the second dielectric layer comprise similar textures as the texture of the first TCO layer.

5. The device of claim 1, wherein each of the first and second dielectric layers comprises a material selected from the group consisting of TiOx, TaOx, HfOx, ZrOx, WOx, FeOx, SiOx, NiOx, NbOx, VOx, CuOx, AlOx, ZnOx, and GaOx.

6. The device of claim 1, wherein the metal layer comprises a material that prevents diffusion of oxygen ions between the first and the second dielectric layers.

7. The device of claim 1, wherein the metal layer comprises metal nanoparticles.

8. The device of claim 1, wherein the device is configured to function as a resistive random access memory (RRAM) device or a threshold switching device.

9. The device of claim 1, wherein the device is forming-free.

10. The device of claim 1, wherein a current-voltage (I-V) characteristics of the device exhibits a self-compliance current.

11. A resistive random access (RRAM) device, the device comprising:
    a bottom electrode;
    a top electrode over the bottom electrode;
    a metal layer between the top electrode and the bottom electrode;
    a first dielectric layer between and contacting the bottom electrode and the metal layer; and
    a second dielectric layer between and contacting the top electrode and the metal layer.

12. The RRAM device of claim 11, wherein the bottom electrode and the top electrode comprises a first transparent conducting oxide (TCO) layer and a second TCO layer, respectively.

13. The RRAM device of claim 12, wherein the bottom electrode further comprises a first conductive layer underlying the first TCO layer, and wherein the top electrode further comprises a second conductive layer overlying the second TCO layer.

14. The RRAM device of claim 12, wherein the first TCO layer comprises a texture in a cross-sectional view, wherein the texture comprises a narrowing shape or a pointed shape.

15. The RRAM device of claim 11, wherein each of the first and second dielectric layers comprises an oxide or a transition metal oxide.

16. A semiconductor device comprising:
    a first transparent conducting oxide (TCO) layer with a first texture;
    a first dielectric layer over the first TCO layer;
    a metal layer comprising metal nanoparticles over the first dielectric layer, wherein the first dielectric layer is between the first TCO layer and the metal layer;
    a second dielectric layer over the metal layer;
    a second TCO layer over the second dielectric layer, wherein the second dielectric layer is between the second TCO layer and the metal layer.

17. The semiconductor device of claim 16, wherein each of the first dielectric layer, the metal layer, and the second dielectric layer has a texture similar to the first texture of the first TCO layer.

18. The semiconductor device of claim 16, wherein the first dielectric layer is a polycrystalline $TiO_x$ layer, and the second dielectric layer is an amorphous $TiO_x$ layer.

19. The semiconductor device of claim 18, wherein the x value of the polycrystalline $TiO_x$ layer is between about 1.8 and about 1.95, and the x value of the amorphous $TiO_x$ layer is between about 1.5 and about 1.7.

20. The RRAM device of claim 11, wherein the RRAM device is forming-free.

* * * * *